(12) United States Patent
Yamazaki et al.

(10) Patent No.: US 6,371,017 B1
(45) Date of Patent: *Apr. 16, 2002

(54) PRINTING METHOD AND PRINTING APPARATUS

(75) Inventors: Osamu Yamazaki, Toyonaka; Kimihito Kuwabara, Uji; Kazumi Ishimoto, Katano; Toshiaki Yamauchi, Yawata; Toshinori Mimura, Katano, all of (JP)

(73) Assignee: Matsushita Electric Industrial Co., Ltd., Kadoma (JP)

( * ) Notice: Subject to any disclaimer, the term of this patent is extended or adjusted under 35 U.S.C. 154(b) by 0 days.

This patent is subject to a terminal disclaimer.

(21) Appl. No.: 09/708,415

(22) Filed: Nov. 9, 2000

Related U.S. Application Data

(62) Division of application No. 09/180,784, filed as application No. PCT/JP97/01650 on May 16, 1997, now Pat. No. 6,230,619.

(30) Foreign Application Priority Data

May 17, 1996 (JP) ................................................ 8-123393

(51) Int. Cl.⁷ ............................. B41F 15/08; B41M 1/12

(52) U.S. Cl. ........................................ 101/129; 101/484
(58) Field of Search ............................... 101/114, 123, 101/129, 484, 487

(56) References Cited

U.S. PATENT DOCUMENTS

| 4,050,269 A | 9/1977 | Mayer ........................ 101/470 |
| 4,911,948 A | 3/1990 | McIntyre .................... 427/282 |
| 5,740,729 A | 4/1998 | Hikita et al. ................. 101/484 |

FOREIGN PATENT DOCUMENTS

| JP | 3-193448 | 8/1991 |
| JP | 4-14288 | 1/1992 |
| JP | 4-223137 | 8/1992 |

*Primary Examiner*—Stephen R. Funk
(74) *Attorney, Agent, or Firm*—Wenderoth, Lind & Ponack, L.L.P.

(57) ABSTRACT

The temperature of a portion that belongs to a stencil and is located in the vicinity of a portion retaining a printing paste is increased to reduce the viscosity of printing paste that adheres to the portion retaining the printing paste, thereby allowing the printing paste to be easily separated from the retaining portion for the achievement of easy printing on an object on which a print is to be formed.

17 Claims, 19 Drawing Sheets

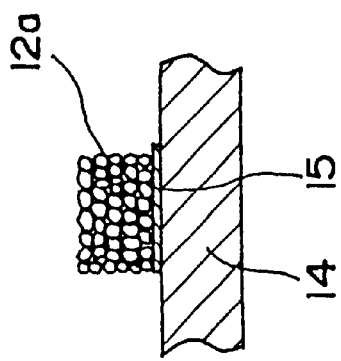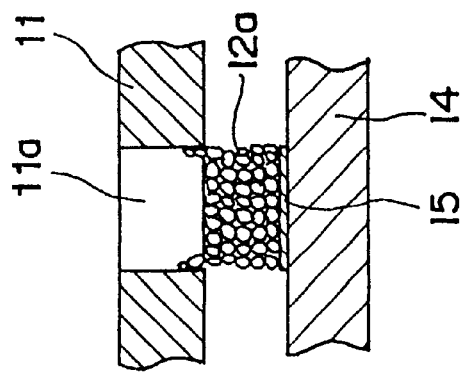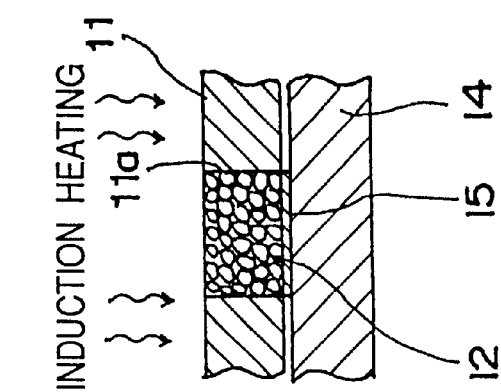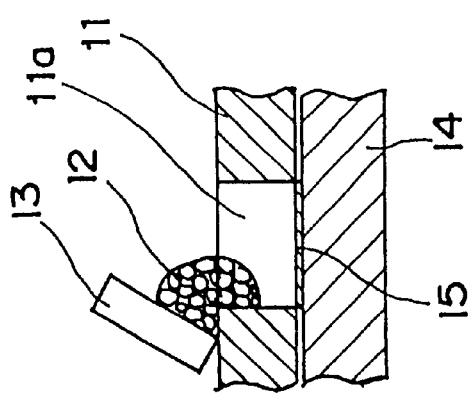

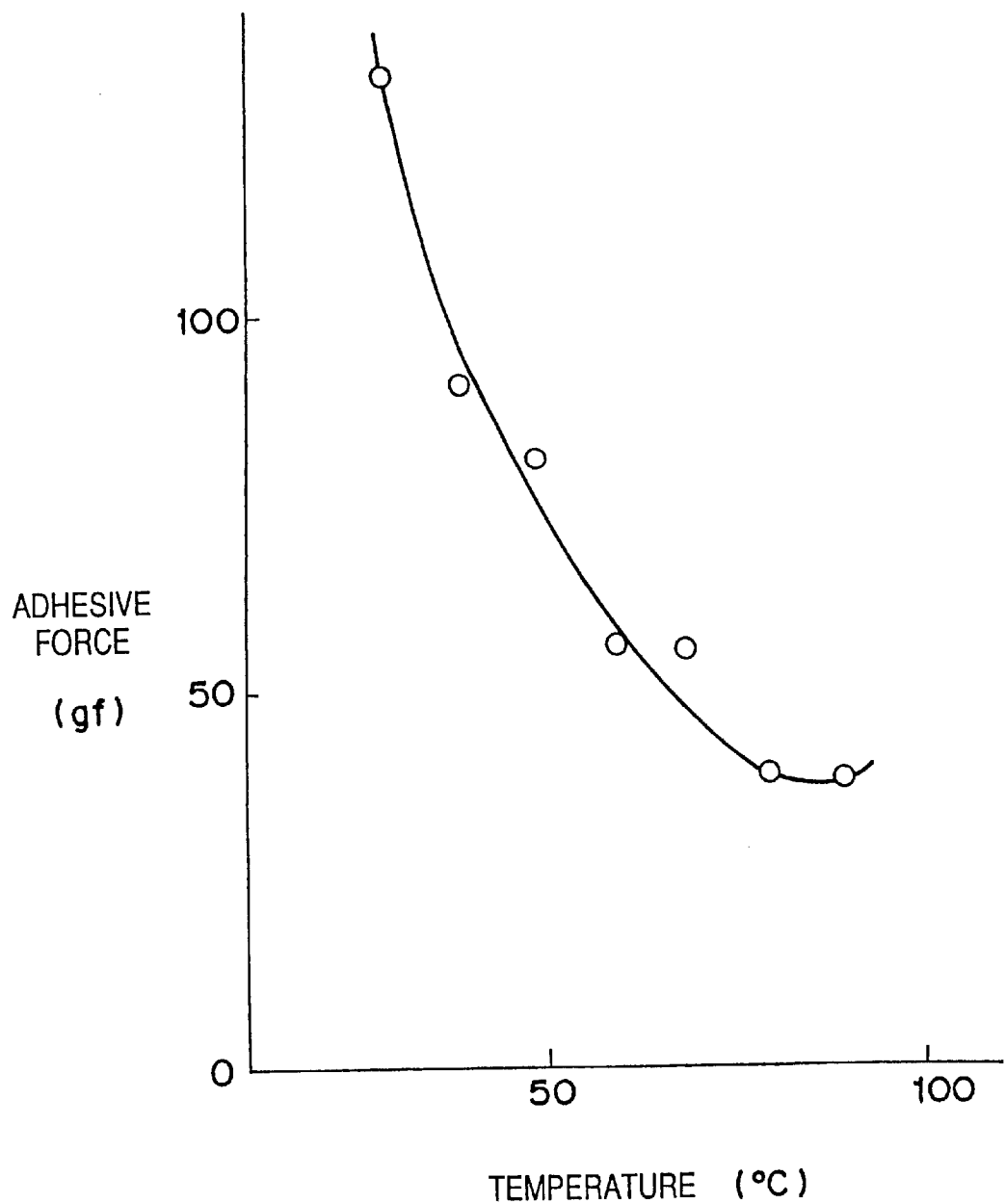

X-DIRECTION

45°

Y-DIRECTION

Fig. 14
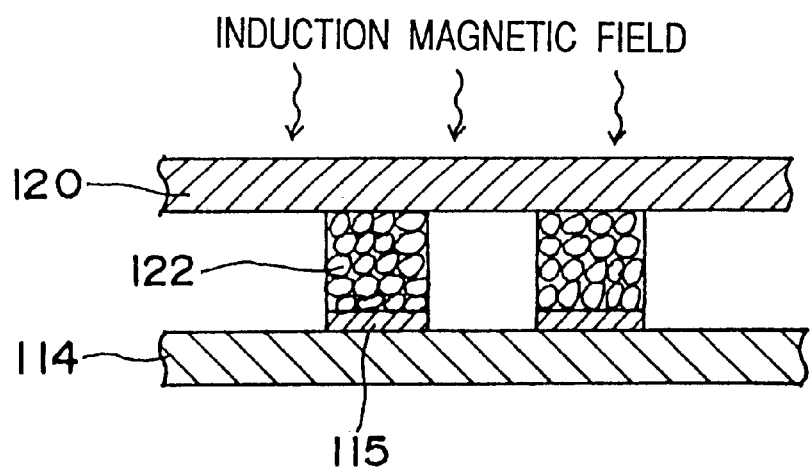
Fig.15A
Fig.15B
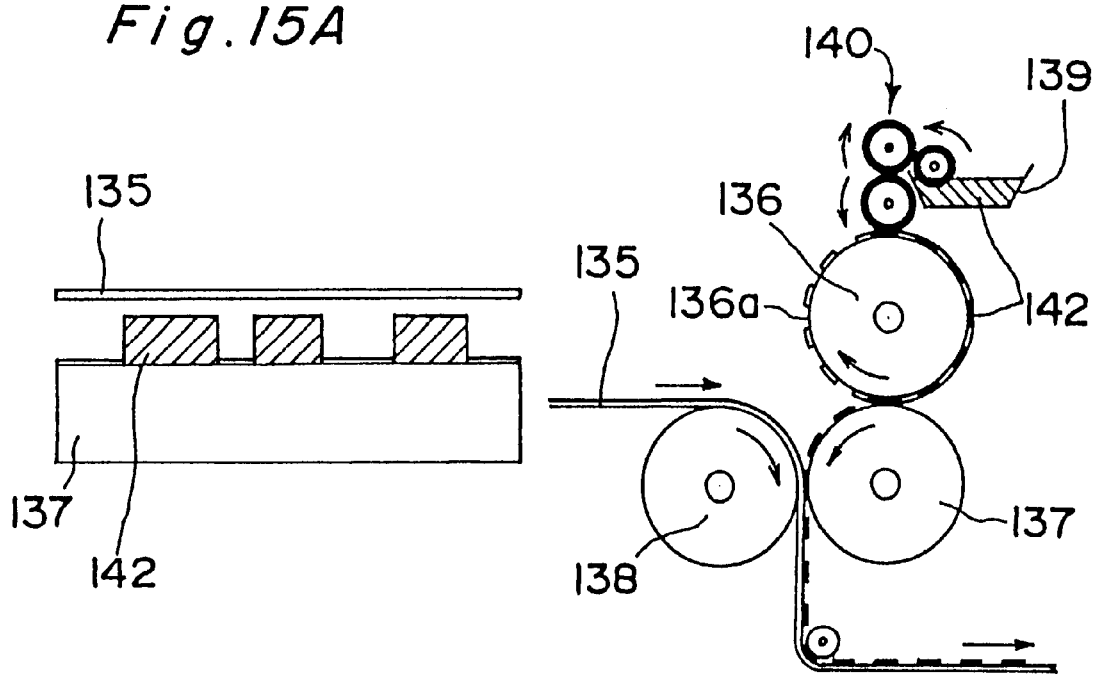

PRINTING METHOD AND PRINTING APPARATUS

This is a divisional application of Ser. No. 09/180,784, filed Nov. 16, 1998, now U.S. Pat. No. 6,230,619 which is a 371 of PCT/JP97/01650 filed May 16, 1997.

TECHNICAL FIELD

The present invention relates to a printing method for transferring a printing paste retained on a stencil (plate) onto an object on which a print is to be formed and printing apparatus for implementing the printing method.

BACKGROUND ART

Conventionally, according to a planographic stencil (screen) type printing for printing, for example, solder paste on lands of a printed circuit board, as shown in FIG. 18A and FIG. 18B, a screen mask (metal mask) 1 having through holes 1a arranged in a specified pattern in correspondence with lands 5 of the printed circuit board 4 is placed in a specified position on the board 4 while being brought in contact with the board. Next, as shown in FIG. 18C, FIG. 19A and FIG. 19B, solder paste 2 is supplied to one end of the screen mask 1, and this solder paste 2 is moved by a squeegee 3 from the one end of the screen mask 1 in a specified direction, thereby filling the solder paste 2 into each through hole 1a of the screen mask 1. Next, as shown in FIG. 18D, the screen mask 1 is separated from the board 4 so as to move the solder paste 2 inside the through holes 1a of the screen mask 1 onto the lands 5 of the board 4, thereby forming solder paste layers 2a on the lands 5 of the board 4 as shown in FIG. 18E.

However, according to the above structure, as shown in FIG. 19C, part of the solder paste 2 is left inside the through hole 1a of the screen mask 1 while adhering to the inner wall of the through hole due to the viscosity of the solder paste itself when the screen mask 1 is separated from the board 4, and this disadvantageously causes a phenomenon that the solder paste continuously extends across the left solder paste 2 and the solder paste 2 placed on the land 5 of the board 4. Consequently, as the screen mask 1 moves away from the board 4, the relative deformation (shear rate gradient) of the continuously extending solder paste increases to be pulled and broken at an arbitrary portion between the screen mask 1 and the board 4. Part of the solder paste that has been pulled and broken adheres to a portion other than the land 5 on the board 4 as shown in FIG. 19D and adheres to the peripheral portion of the through hole 1a on the rear surface of the screen mask 1 on the board side. This has disadvantageously caused a printing blur in the next printing stage, the occurrence of a bridge defined by the inadvertent adhesion of the solder paste to the adjacent solder paste layer 2a on the board 4, and the insufficient formation of a solder paste layer on the board due to the adhesion of the solder paste to the screen mask.

Accordingly, the object of the present invention is to solve the aforementioned issues and provide a printing method and printing apparatus capable of accurately pulling and breaking the printing paste between the stencil on which the printing paste is retained and the board while causing no bridging, causing no printing blur attributed to the printing paste left on the stencil side and causing no shortage of supply of the printing paste onto the board.

DISCLOSURE OF INVENTION

In order to achieve the above object, the present invention is constructed so that the temperature of the portion which belongs to the stencil and on which the printing paste of the stencil is retained is increased so as to reduce the viscosity of the printing paste that adheres to the printing paste retaining portion and allow the printing paste to be easily separated from the retaining portion, thereby making the printing paste easy to be printed on the object on which a print is to be formed.

According to a first aspect of the present invention, there is provided a printing method comprising:
retaining on a stencil a printing paste having a characteristic that a viscosity reduces as temperature increases;
increasing a temperature of a portion which belongs to the stencil and on which the printing paste is retained so as to reduce the viscosity of the printing paste to be brought in contact with the portion, thereby making the printing paste easy to separate from the stencil; and
separating the printing paste retained on the stencil from the stencil so as to print the printing paste on an object on which a print is to be formed.

According to a second aspect of the present invention, there is provided a printing method based on the first aspect, wherein the portion which belongs to the stencil and on which the printing paste is retained is heated by electromagnetic induction heating to increase the temperature of the portion.

According to a third aspect of the present invention, there is provided a printing method based on the second aspect, wherein the stencil has an opening portion to be arranged in a specified pattern for retaining the printing paste, and the stencil and the object are relatively separated apart after the stencil comes in contact with the object, thereby printing the printing paste inside the opening portion onto the object.

According to a fourth aspect of the present invention, there is provided a printing method based on the third aspect, wherein an electromagnetic induction heating unit for performing the electromagnetic induction heating performs the electromagnetic induction heating of the stencil in a non-contact manner.

According to a fifth aspect of the present invention, there is provided a printing method based on the fourth aspect, wherein an interval between the electromagnetic induction heating unit and the stencil is constructed so as to have a dimension such that a specified induction current flows through the stencil by the electromagnetic induction heating unit.

According to a sixth aspect of the present invention, there is provided a printing method based on the third aspect, wherein an electromagnetic induction heating unit for performing the electromagnetic induction heating performs the electromagnetic induction heating of the stencil in a contact manner.

According to a seventh aspect of the present invention, there is provided a printing method based on any one of the third through sixth aspects, wherein the electromagnetic induction heating is performed after retention of the printing paste on the opening portion of the stencil is finished.

According to an eighth aspect of the present invention, there is provided a printing method based on any one of the third through seventh aspects, wherein the opening portion is a through hole, the stencil is a screen mask, and the printing paste is filled into the through hole by moving a squeegee.

According to a ninth aspect of the present invention, there is provided a printing method based on any one of the third through eighth aspects, wherein a print state is detected after the printing paste is printed on the object, and an electromagnetic induction heating condition of the stencil or a condition of separation of the stencil from the object is controlled on the basis of a result of detection.

According to a tenth aspect of the present invention, there is provided a printing method based on any one of the third through ninth aspects, wherein the print material has a temperature gradient such that the portion put in contact with the portion retained by the stencil has a high temperature and the temperature gradually reduces departing from the portion in the electromagnetic induction heating.

According to an eleventh aspect of the present invention, there is provided a printing method based on any one of the third through tenth aspects, wherein an induction current for generating the electromagnetic induction heat flows in the lengthwise direction of the opening portion of the stencil.

According to a twelfth aspect of the present invention, there is provided a printing apparatus comprising:

a heating unit for increasing a temperature of a portion which belongs to a stencil for retaining a printing paste having a characteristic that a viscosity reduces as temperature increases and on which the printing paste is retained so as to reduce the viscosity of the printing paste to be brought in contact with the portion, thereby making the printing paste easy to separate from the stencil; and a printing paste separation unit for separating the printing paste retained on the stencil from the stencil so as to print the printing paste on an object on which a print is to be formed.

According to a thirteenth aspect of the present invention, there is provided a printing apparatus based on the twelfth aspect, further comprising a stencil for retaining the printing paste having a characteristic that its viscosity reduces as its temperature increases.

According to a fourteenth aspect of the present invention, there is provided a printing apparatus based on the twelfth or thirteenth aspect, further comprising an electromagnetic induction heating unit for heating by electromagnetic induction heating the portion which belongs to the stencil and on which the printing paste is retained, thereby increasing the temperature of the portion.

According to a fifteenth aspect of the present invention, there is provided a printing apparatus based on the twelfth or thirteenth aspect, wherein the stencil has an opening portion to be arranged in a specified pattern for retaining the printing paste, and the separation unit separates the stencil relatively from the object after the stencil comes in contact with the object, thereby printing the printing paste inside the opening portion onto the object.

According to a sixteenth aspect of the present invention, there is provided a printing apparatus based on the fifteenth aspect, wherein the electromagnetic induction heating unit for performing the electromagnetic induction heating performs the electromagnetic induction heating of the stencil in a noncontact manner.

According to a seventeenth aspect of the present invention, there is provided a printing apparatus based on the sixteenth aspect, wherein an interval between the electromagnetic induction heating unit and the stencil is constructed to have a dimension such that a specified induction current flows through the stencil by the electromagnetic induction heating unit.

According to an eighteenth aspect of the present invention, there is provided a printing apparatus based on the fifteenth aspect, wherein the electromagnetic induction heating unit for performing the electromagnetic induction heating performs the electromagnetic induction heating of the stencil in a contact manner.

According to a nineteenth aspect of the present invention, there is provided a printing apparatus based on any one of the fifteenth through eighteenth aspects, wherein the electromagnetic induction heating is performed after retention of the printing paste on the opening portion of the stencil is finished.

According to a twentieth aspect of the present invention, there is provided a printing apparatus based on any one of the fifteenth through nineteenth aspects, wherein the opening portion is a through hole, the stencil is a screen mask, and the printing paste is filled into the through hole by moving a squeegee.

According to a twenty-first aspect of the present invention, there is provided a printing apparatus based on any one of the fifteenth through twentieth aspects, further comprising a control section for detecting a print state after the printing paste is printed on the object and controls an electromagnetic induction heating condition of the stencil or a condition of separation of the stencil from the object on the basis of a result of detection.

According to a twenty-second aspect of the present invention, there is provided a printing apparatus based on any one of the fifteenth through twenty-first aspects, wherein the print material has a temperature gradient such that the portion put in contact with the portion retained by the stencil has a high temperature and the temperature gradually reduces departing from the portion in the electromagnetic induction heating.

According to a twenty-third aspect of the present invention, there is provided a printing apparatus based on any one of the fifteenth through twenty-second aspects, wherein an induction current for generating the electromagnetic induction heat flows in the lengthwise direction of the opening portion of the stencil.

According to the above aspects of the present invention, the stencil itself is heated by induction heating, so that the temperature of the printing paste portion retained by the stencil (the portion of the printing paste that comes into contact with the inner wall surface of the through hole of the stencil and the portion in the vicinity of the portion) is increased more than in the inner portion, resulting in a reduced viscosity. As a result, the adhesive force of the printing paste between the stencil and the printing paste is reduced, as a consequence of which a resistance force when the printing paste is easily separated from the stencil becomes small to allow the stencil separation operation to be satisfactorily achieved. Therefore, no printing paste is left on the stencil side, so that no blur of printing is caused in the next printing stage and a specified amount of printing paste is supplied, that is, the printing paste is supplied in a specified shape to a specified position on the object on which a print is to be formed, thereby allowing a printing paste layer to be formed by printing. According to the above aspects of the present invention, the resistance of the printing paste in the inner wall surface portion of the through hole of the stencil becomes small. Therefore, a satisfactory print result can be obtained even when the stencil separation velocity is set higher (for example, not smaller than 1 mm/s and not greater than 3 mm/s) than the conventional stencil separation velocity (for example, not smaller than 0.1 mm/s and smaller than 1 mm/s) or without velocity control.

According to the above induction heating, the stencil itself generates heat, and therefore, the discharge of heat of the stencil can be immediately performed after the stop of the induction heating. Therefore, the portion other than the stencil is not heated, exerting no bad influence on the next printing operation, the devices around the stencil and so on.

In contrast to this, according to the method of heating the stencil by externally radiating heat as observed in the case of hot air, radiation heating (infrared heating), or conduction heating, the members and air around the stencil are heated and the members and air around the heating unit, which also generates heat, are disadvantageously heated. Therefore, bad influence is sometimes exerted on the next printing operation, the devices around the stencil and so on. According to the method of transmitting heat from the heating unit to the stencil, the heat is conducted not only to the stencil but also to the heating unit and the members and air around the stencil, resulting in the drawback that heating efficiency is bad.

When performing induction heating in a noncontact manner without bringing the induction heating unit in contact with the stencil, the induction heating unit is not brought in contact with the printing paste on the surface of the stencil, and therefore, the induction heating unit is not smeared by the printing paste. In the case where an electronic component exists on the lower surface of the object on which a print is to be formed, the noncontact method can prevent the exertion of bad influence on the electronic component during the induction heating because of an increased distance from the electronic component.

BRIEF DESCRIPTION OF DRAWINGS

These and other aspects and features of the present invention will become clear from the following description taken in conjunction with the preferred embodiments thereof with reference to the accompanying drawings, in which:

FIG. 1A, FIG. 1B, FIG. 1C, and FIG. 1D are, respectively, explanatory views for explaining a printing method according to one embodiment of the present invention;

FIG. 8 is a graph showing a relation between the temperature and the viscosity of the solder paste;

FIG. 14 is an explanatory view of one embodiment of the present invention in the case where the present invention is applied to a direct-printing planographic transfer printing system;

FIG. 15A and FIG. 15B are explanatory views of one embodiment of the present invention in the case where the present invention is applied to an offset printing system, respectively;

DETAILED DESCRIPTION OF THE INVENTION

Figure 2:
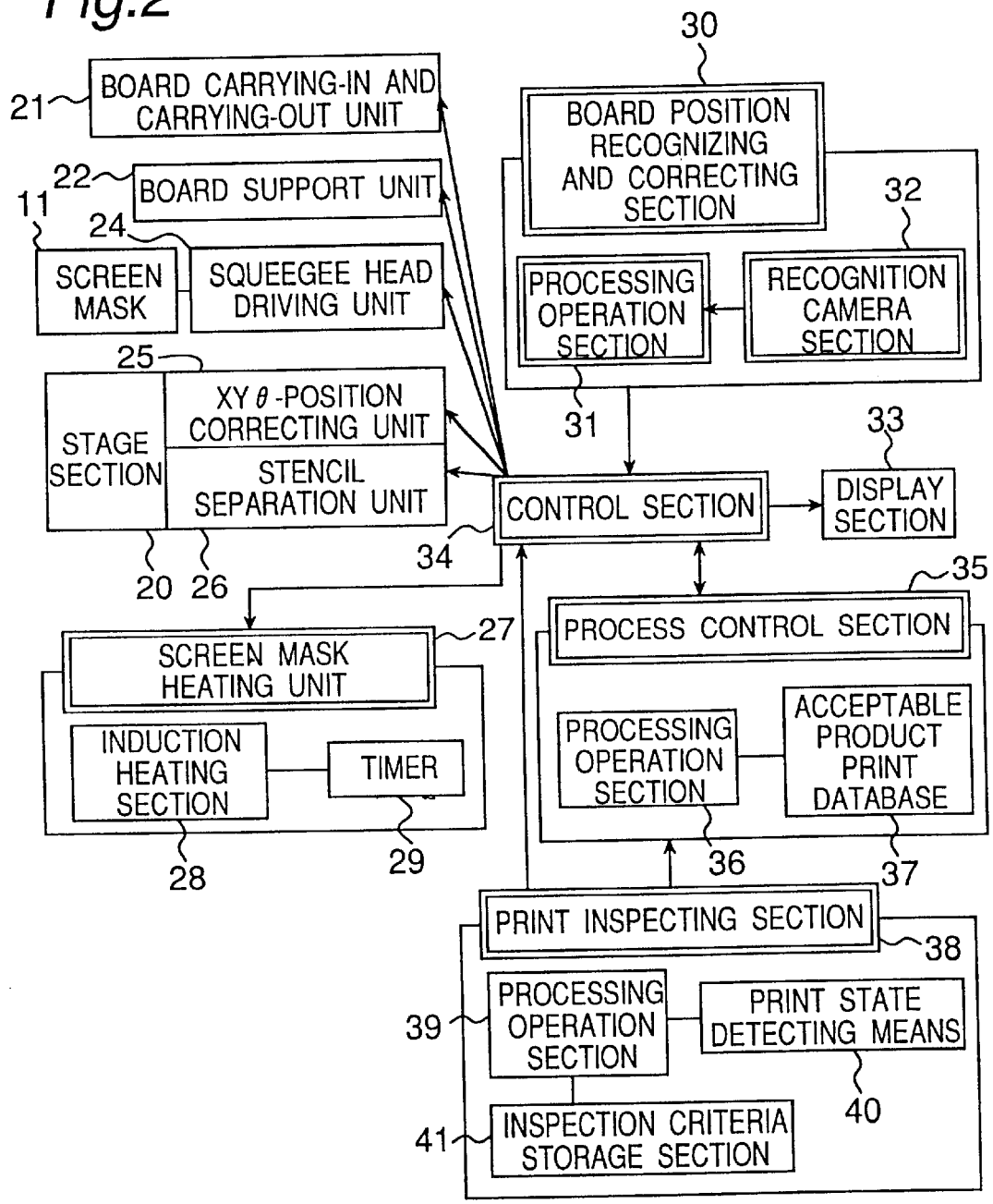
FIG. 2 is a block diagram of a printing apparatus according to one embodiment of the present invention.

Before the description of the present invention proceeds, it is to be noted that like parts are designated by like reference numerals throughout the accompanying drawings.

Embodiments according to the present invention will be described in detail below with reference to FIG. 1A through FIG. 17 and FIGS. 20, 21, and 22.

A printing method according to one embodiment of the present invention is related to a planographic stencil (screen) type printing method for printing a printing paste such as solder paste on lands of a printed circuit board as shown in FIG. 1A through FIG. 1D. The printing method according to this embodiment is as follows. First, as shown in FIG. 1A, a screen mask (metal mask) 11 having through holes 11a arranged in a specified pattern in correspondence with the lands 15 of a printed circuit board 14 is placed in a specified position on the board 14 while being brought in contact with the board. Next, a solder paste 12 is supplied onto one end of the screen mask 11, and this solder paste 12 is moved by a squeegee 13 in a specified direction from the one end of the screen mask 11, thereby filling the solder paste 12 into the through holes 11a of the screen mask 11. Next, as shown in FIG. 1B, the temperatures of the inner wall surfaces of the through holes 11a of the screen mask 11 are increased by induction heating. In this stage, the temperatures of the inner wall surfaces are increased to temperatures at which the viscosity of the solder paste 12 to be used is reduced to become hard to adhere to the inner wall surfaces of the through holes 11a of the screen mask 11. Next, as shown in FIG. 1C, the screen mask 11 is separated from the board 14, so that the solder paste 12 inside the through holes 11a of the screen mask 11 is moved onto the lands 15 of the board 14, thereby forming solder paste layers 12a on the lands 15 of the board 14 as shown in FIG. 1D. In this stage, the viscosity of the solder paste 12 is reduced by the induction heating, and therefore, the solder paste 12 inside the through holes 11a of the screen mask 11 scarcely adheres to the inner wall surfaces of the through holes 11a. Therefore, the solder paste 12 inside the through holes 11a is left formed as the solder paste 12 is on the lands 15 of the board 14 even when the screen mask 11 is separated from the board 14, so that the solder paste layers 12a of specified shapes can be formed in specified positions.

Figure 3:
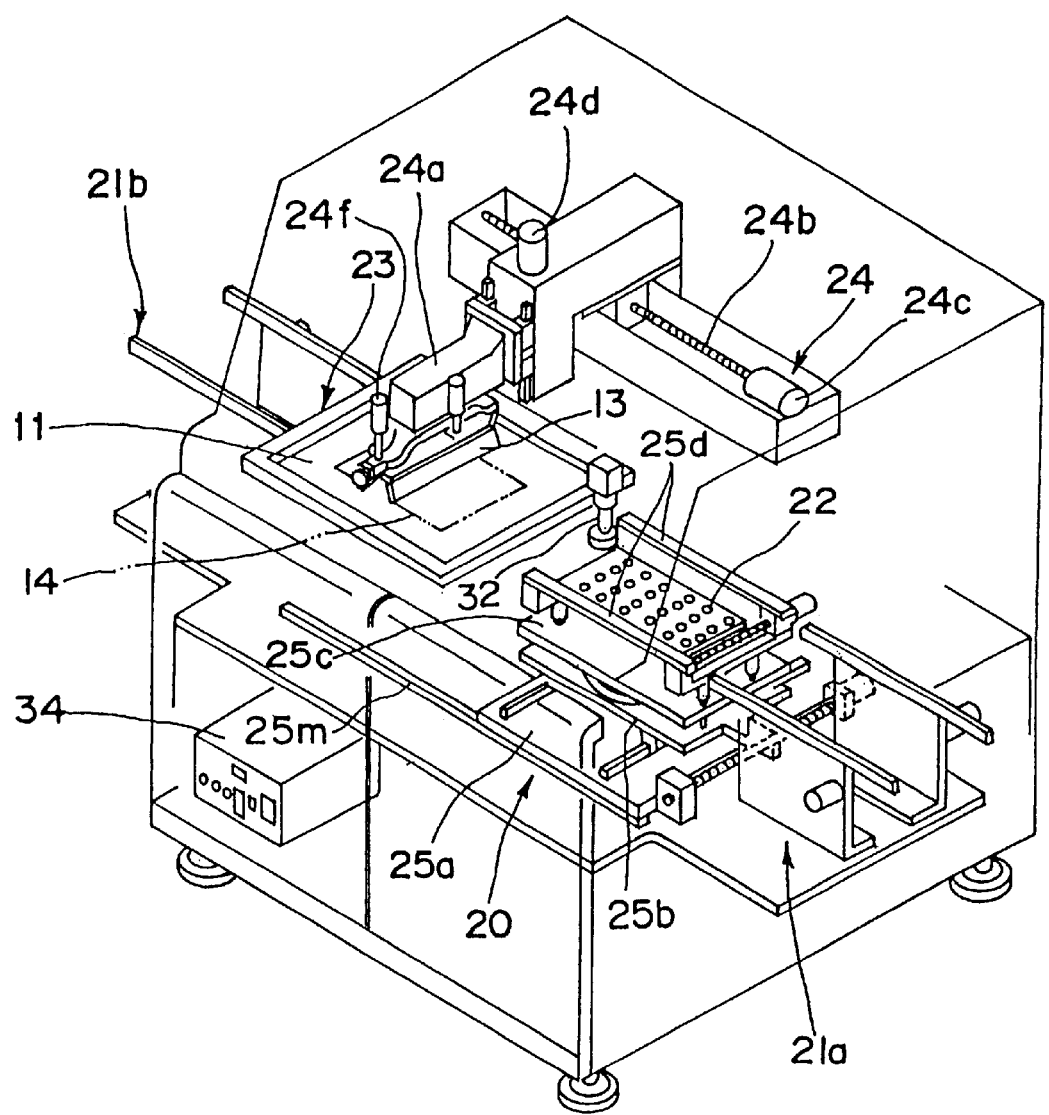
FIG. 3 is a perspective view of the printing apparatus of FIG. 2.
Figure 4:
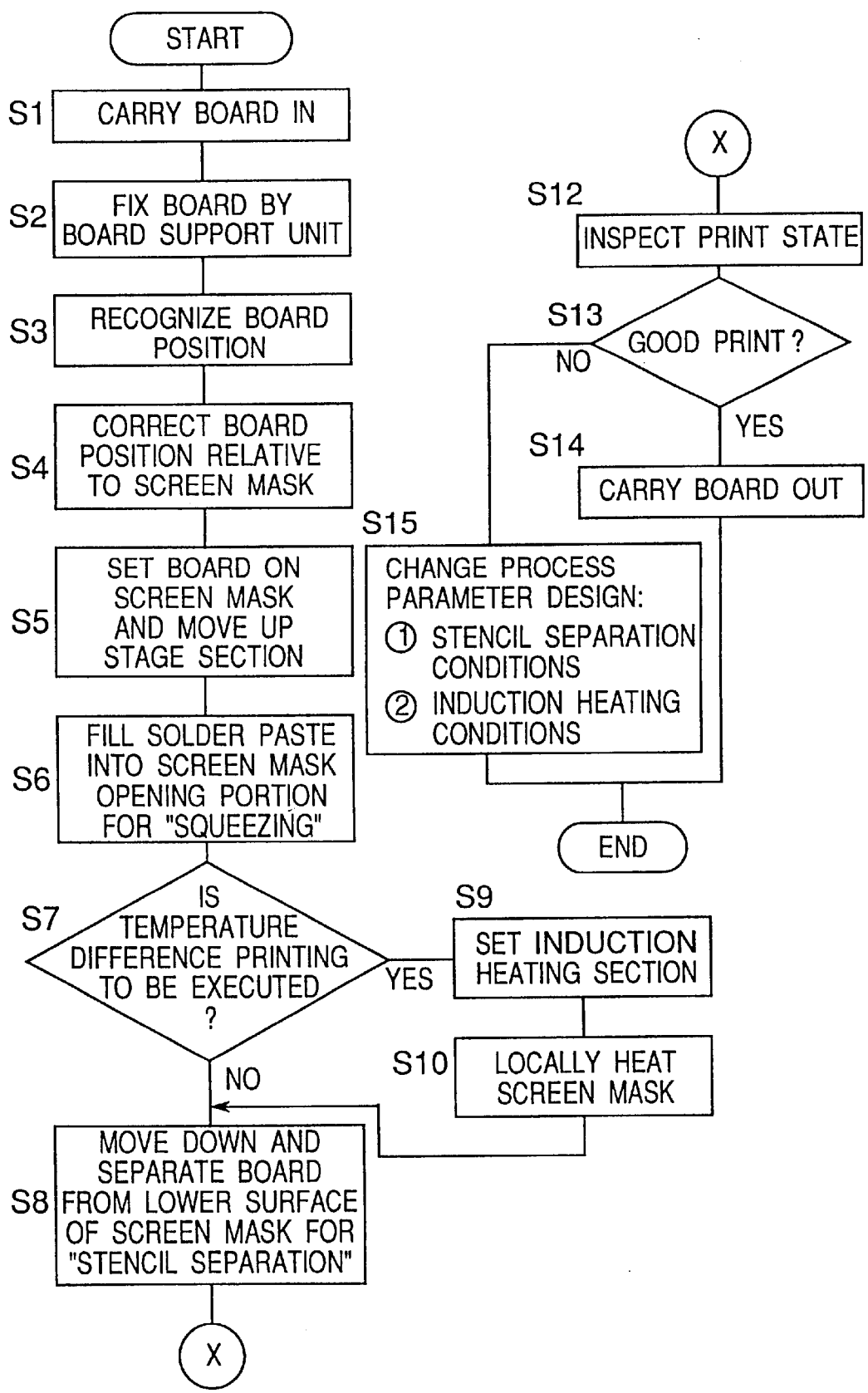
FIG. 4 is a flow chart of the printing operation of the printing apparatus of FIG. 2.

The printing method according to the above embodiment can be implemented by a printing apparatus according to one embodiment of the present invention as shown in FIGS. 2 and 3. More concrete operation of the printing method executed by this printing apparatus is shown in the flowchart of FIG. 4.

In the printing apparatus shown in FIG. 2, a board carrying-in and carrying-out unit 21 provided with a carrying-in unit 21a and a carrying-out unit 21b, a board support unit 22, a screen mask 11, a squeegee head driving unit 24, a stage section 20 provided with an XYθ-position correcting unit 25 and a stencil separation unit 26, and a screen mask heating unit 27 provided with an induction heating section 28 and a timer 29 can be respectively driven under control of a control section 34. The control section 34 receives the inputs of board position recognition correction information from a board position recognizing and correcting section 30 provided with a processing operation section 31 and a recognition camera section 32 as well as print inspection information from a print inspecting section 38 provided with a processing operation section 39, a print state detecting means 40, and an inspection criteria storage section 41. The control section 34 inputs process information to and outputs process information from a process control section 35 provided with a processing operation section 36 and an acceptable product print database 37 and receives the input of information of the print state from the print inspecting section 38, thereby executing process control. The control section 34 displays the results of operation and inspection, the state of the printed solder paste 12, and so forth on a display section 33 as the occasion demands.

The board 14 is carried in to the stage section 20 by the carrying-in unit 21a of the board carrying-in and carrying-out unit 21, corrected in position in the stage section 20, thereafter moved to a printing position, printed in the printing position, and thereafter carried out of the printing apparatus from the printing position by the carrying-out unit 21b of the board carrying-in and carrying-out unit 21.

In the stage section 20, first, the board 14 is retained in position by the board support unit 22 provided in the stage section 20. The board 14 is retained in position by, for example, a method for vacuum-sucking the board 14 with a number of suction holes opened on the surface of the board support unit 22, a method for supporting the lower surface of the board 14 by means of a number of backup pins or the like. In the state in which the board 14 is retained in position, a position correcting mark(s) (not shown) of the board 14 is recognized by the recognition camera section 32 of the board position recognizing and correcting section 30. The processing operation section 31 calculates a positional displacement between the recognized position of the board 14 and the position of the screen mask 11, and calculates the position correction amount of the board 14 for correcting this positional displacement. This result of calculation is inputted to the XYθ-position correcting unit 25 of the stage section 20. On the basis of this inputted position correction information, the positional correction of the board 14 relative to the screen mask 11 is executed by the XYθ-position correcting unit 25 of the stage section 20. That is, the XYθ-position correcting unit 25 executes the positional correction of the board 14 in the orthogonal XY-directions along the horizontal plane of the printing apparatus and in a θ-direction around the Z-axis in the vertical direction relative to the screen mask 11 on the basis of the above position correction information. The XYθ-position correcting unit 25 is constructed so that a Y-direction table 25b capable of moving in the Y-direction is placed on an X-direction table 25a capable of moving in the X-direction (direction in which the board is carried in and out) and a θ-direction table 25c capable of turning in the θ-direction is further placed on them. Then, by moving each of the tables in the respective directions by the position correction amount, the positional correction of the board 14 is executed. It is to be noted that the positional correction in the X-direction is executed by the X-direction table 25a after the positional correction in the Y-direction and the θ-direction is completed and before the board 14 is brought in contact with the screen mask 11 after the board 14 is moved to the printing position and stopped there.

Figure 20:
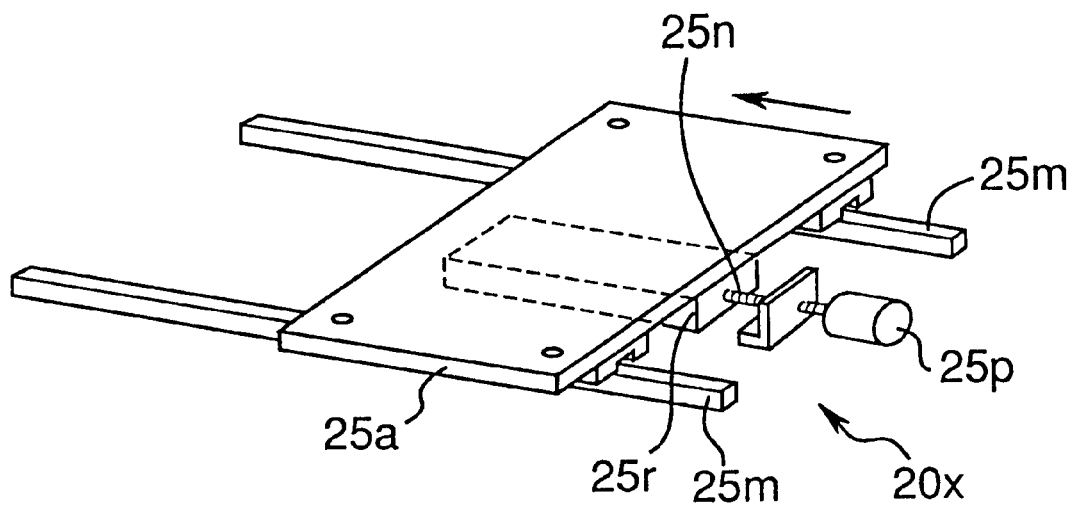
FIG. 20 is a perspective view of an X-direction driving unit according to the above embodiment of the present invention.

An X-direction driving unit 20x that concurrently serves as this X-direction position correcting unit is shown in FIG. 20. In FIG. 20, the X-direction table 25a is arranged movably in the X-direction along a pair of linear guides 25m extending in the X-direction, and a threaded shaft 25n is rotated forwardly and reversely by driving a driving motor 25p forwardly and reversely, thereby moving forwardly or backwardly the X-direction table 25a fixed to a nut 25r meshed with the threaded shaft 25n in the X-direction.

The board 14 retained by the board support unit 22 is moved in the X-direction to the printing position by the X-direction driving unit 20x of the stage section 20. In the printing position, the board 14 is positioned below the screen mask 11 and moved up until the upper surface of the board 14 is brought in contact with the lower surface of the screen mask 11 by the stencil separation unit 26. Then, in the state in which the lower surface of the screen mask 11 is put in contact with the upper surface of the board 14, the solder paste 12 is supplied to the one end in the X-direction of the screen mask 11, and the squeegee 13 is moved by the squeegee head driving unit 24 from the one end to the other end in the X-direction of the screen mask 11, thereby filling the solder paste 12 into the through hole 11a of the screen mask 11.

The screen mask 11 is constructed by forming, opening portions comprised of through holes 11a corresponding to copper-made conductor pattern portions (lands) 15 of the board 14 through, for example, a plate made of nickel or stainless steel having a thickness of about 150 μm.

The squeegee head driving unit 24 is to move the squeegee 13 on the screen mask 11 in order to fill the solder paste 12 into the through holes 11a of the screen mask 11. The squeegee 13 is constructed of a flat plate or a plate having a sword-like (roughly pentagonal) cross-section shape. The squeegee 13 is moved on the screen mask 11 by forwardly and reversely rotating a ball thread 24b by the driving of a motor 24c and forwardly and backwardly moving a squeegee head 24a meshed with the ball thread 24b in the axial direction of the ball thread 24b. The squeegee head 24a can be moved up and down by the forward and reverse rotation of a motor 24d. The tilt angle of the squeegee 13 itself relative to the screen mask 11 can also be adjusted by a cylinder 24f. That is, the squeegee 13 is pivotally supported at a portion that is not shown, and by upward or downward moving one end of the squeegee 13 by driving the cylinder 24f, the tilt of the squeegee 13 can be adjusted by pivoting the squeegee 13 around the above support point used as a fulcrum.

The solder paste 12 filled in each of the through holes 11a of the screen mask 11 comes to have a lower end surface put in contact with each of the lands 15 of the board 14 corresponding to the through holes 11a, and by separating the screen mask 11 from the board 14 by the stencil separation unit 26, the solder paste layers 12a are formed on the lands 15 of the board 14.

Figure 21:
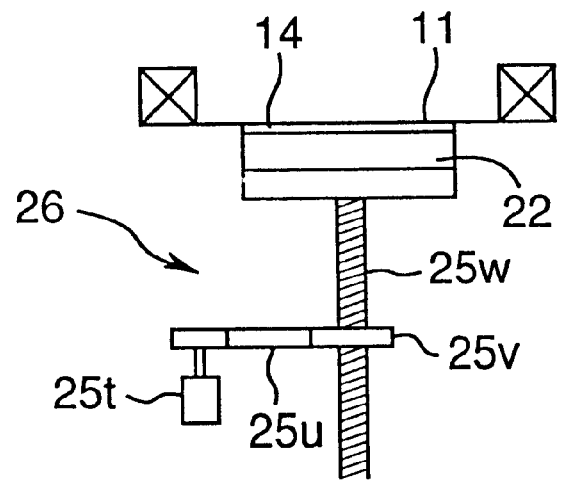
FIG. 21 is a perspective view of a stencil separation unit (Z-direction driving unit) according to the above embodiment of the present invention.

An example of the stencil separation unit 26 is shown in FIG. 21. In FIG. 21, a driving nut 25v is rotated forwardly and reversely via a belt 25u by the forward and reverse rotational driving of an AC servomotor 25t so as to upwardly or downwardly move a threaded shaft 25w in mash with the nut 25v, thereby upward or downward moving the board support unit 22 fixed to the upper end of the threaded shaft 25w for the upward or downward movement of the board 14. Therefore, when the board 14 is moved in the X-direction from a board position correcting operation position to the printing position below the screen mask 11 by the X-direction driving unit 20x of the stage section 20, the AC servomotor 25t of the stencil separation unit 26 is driven to move up the board 14 until the upper surface of the board 14 is brought in contact with the lower surface of the screen mask 11. After the completion of the printing, the board 14 is moved down relative to the screen mask 11 by the driving of the AC servomotor 25t of the stencil separation unit 26 in order to effect the stencil separation operation. The board 14, separated from the stencil, is carried out of the printing apparatus by the carrying-out unit 21b.

Figure 22:
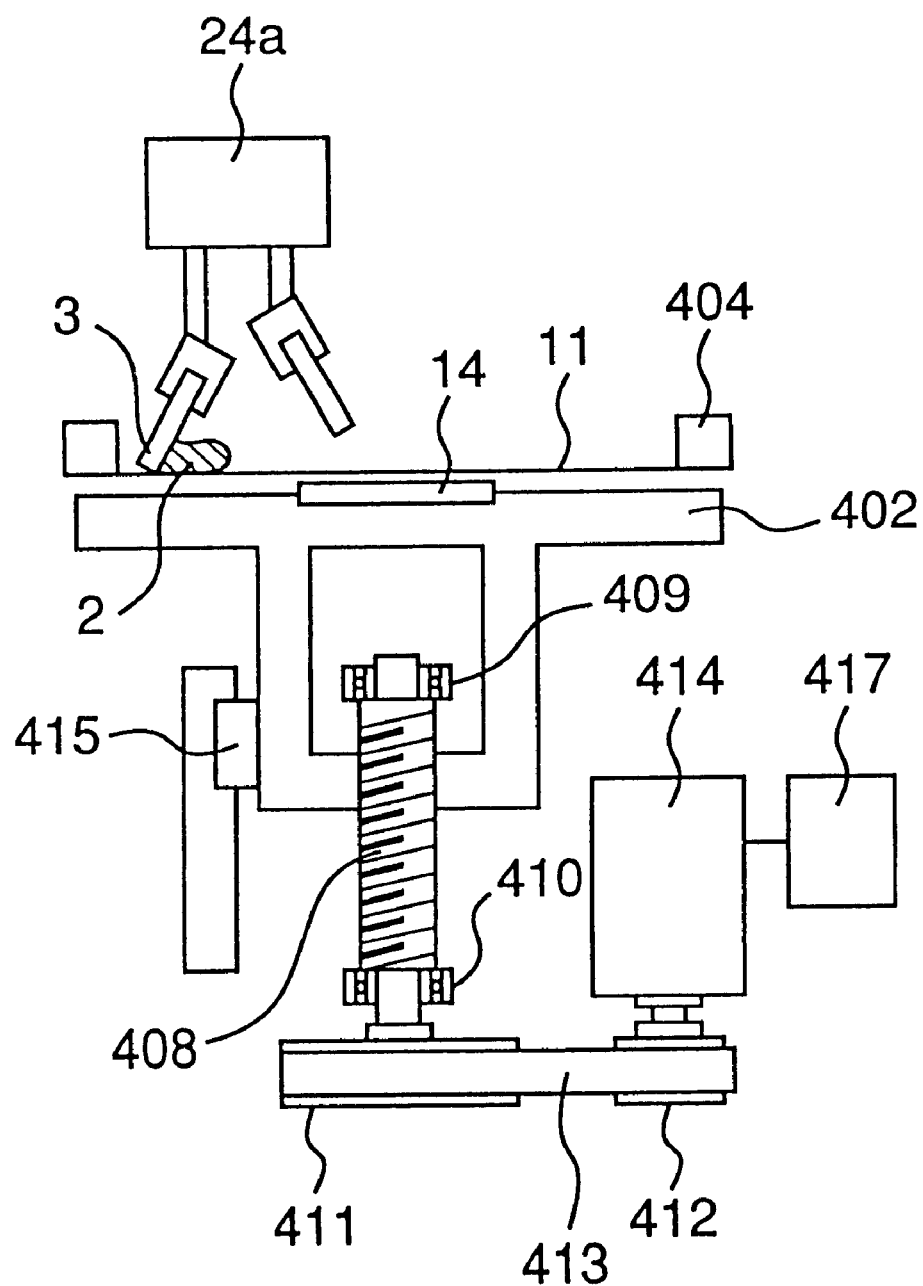
FIG. 22 is a perspective view of another stencil separation unit (Z-direction driving unit) according to the above embodiment of the present invention.

FIG. 22 shows another stencil separation unit. FIG. 22 shows a stage section (board support unit) 402, an AC servo controller 417, an AC servomotor 414 to be controlled by the AC servo controller 417, a ball thread 408 to be rotated forwardly and reversely by an AC servomotor 414, an upper bearing 409 of the ball thread 408, a lower bearing 410 of the ball thread 408, a pulley 411 on the ball thread 408 side, a pulley 412 on the AC servomotor 414 side, a timing belt 413, and a linear guide 415 that guides the upward and downward movement of the stage section 402. This stencil separation unit is constructed so that the stage section (board support unit) 402 can move up and down at an arbitrarily set velocity within an arbitrarily set range by the AC servo controller 417, the AC servomotor 414 and the ball thread 408, whereby the stencil separation velocity of the board 14 with respect to the screen mask 11 can be arbitrarily adjusted.

Figure 5:
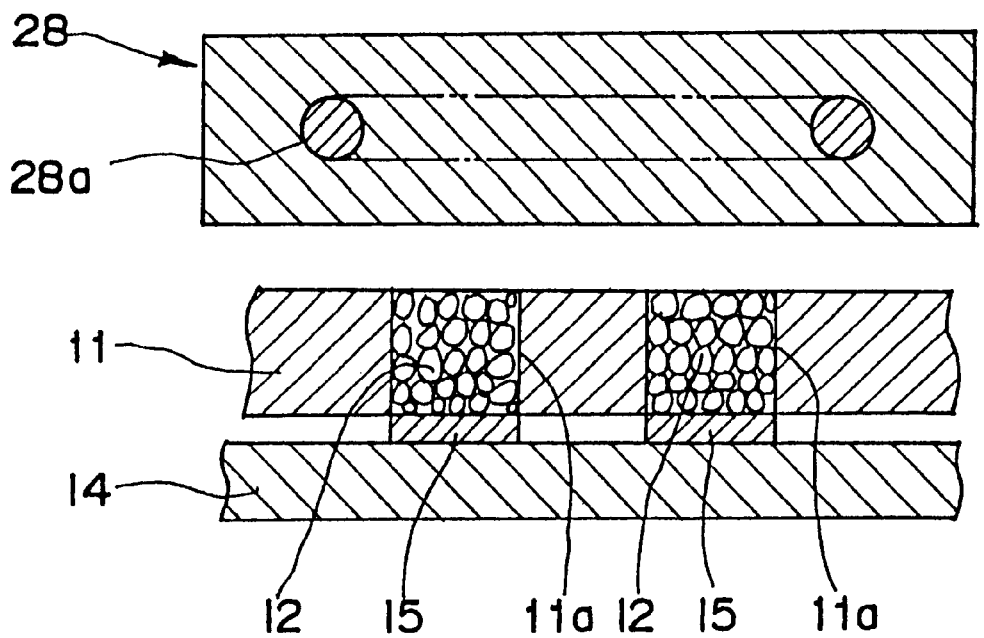
FIG. 5 is a sectional view of a screen mask in a state in which the screen mask is heated by a screen mask heating unit of the above printing apparatus.
Figure 6:
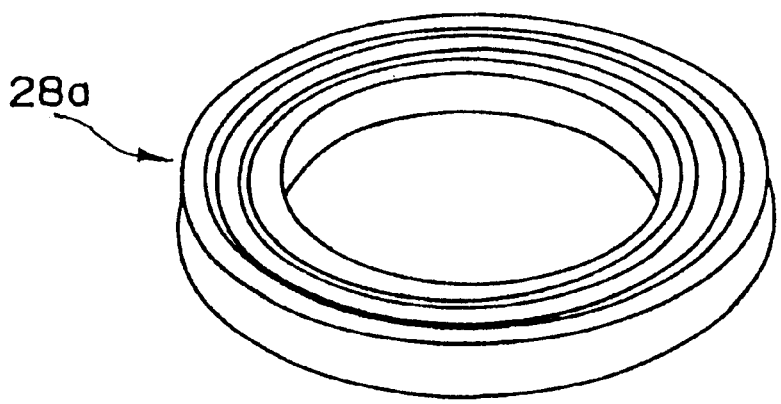
FIG. 6 is a perspective view of an induction coil of the above screen mask heating unit of FIG. 5.

Immediately before executing the stencil separation operation, i.e., immediately after the completion of the printing with the solder paste 12, the screen mask 11 is heated by induction heating by the screen mask heating unit 27. In the screen mask heating unit 27, as shown in FIGS. 5 and 6, a ring-shaped induction coil 28a of the induction heating section 28 is arranged in a state in which the coil is separated apart by a specified distance above the screen mask 11. When the solder paste 12 is filled into the through holes 11a of the screen mask 11, an electric current is made to flow through the induction coil 28a for a time set by the timer 29, that is, for example, a time within several milliseconds to several seconds so as to generate an induction magnetic field and flow an induction current through the screen mask 11 itself, thereby directly heating the screen mask 11 itself by the induction heating. An example of this induction coil 28a has a circular doughnut-shape with an inner wire diameter of 50 mm, an outer diameter of 170 mm and a thickness of 2 mm, and the induction coil is constructed by winding 35 conductive enameled wires or copper wires having a low electrical resistance (generating no Joule's heat) by the number of turns h=21. In regard to induction heating conditions, the induction heating is executed by supplying an electric power of 1400 W for several seconds at 100 V and 60 Hz. In the present embodiment, the induction coil 28a is arranged a specified interval apart from the upper surface of the screen mask 11 in a noncontact manner as shown in FIG. 5. It is acceptable to retreat the coil from above the screen mask 11 during the printing of the solder paste 12 so as not to hinder the printing of the solder paste 12 and move the coil to the place above the screen mask 11 during the induction heating so as to allow the induction heating to be effected. It is preferred that the interval between the induction coil 28a and the screen mask 11 is arranged to a dimension such that a specified current flows through the screen mask 11 by the induction coil 28a.

Figure 7A:
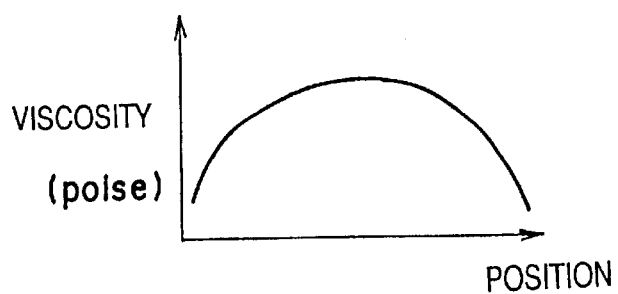
FIG. 7A, FIG. 7B, and FIG. 7C are a graph of a viscosity distribution of solder paste, a graph of a temperature distribution, and a state of the solder paste inside the through hole of the screen mask, respectively.
Figure 7B:
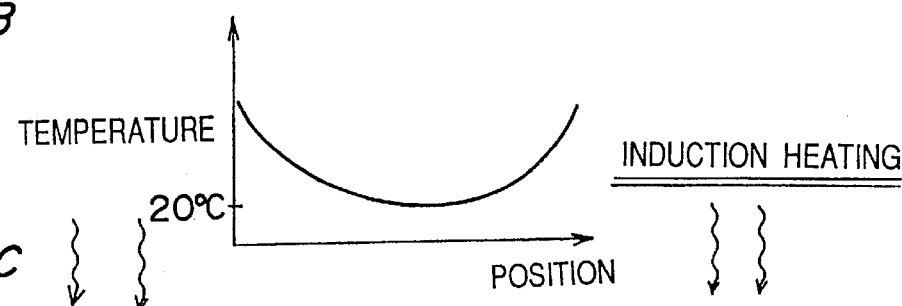
Figure 7C:
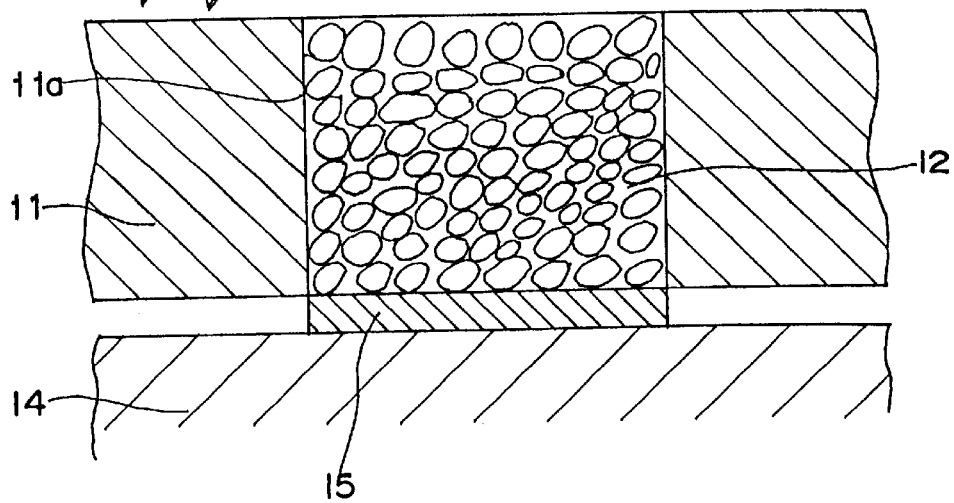

During the induction heating, an induction current flows since the screen mask 11 is made of a conductive material such as stainless steel. However, the stainless steel or the like has a greater resistance than copper, and therefore, the screen mask itself generates heat. In contrast to this, the solder paste 12, which has a small solder particle diameter or a cream-like form due to the flux, exhibits no electric conductivity, so that no induction current flows and no heat is separated. Therefore, as shown in FIG. 7, if the screen mask 11 is heated by the induction heating, then the temperatures of the inner wall surfaces of the through holes 11a of the screen mask 11 are increased. Therefore, the temperature increases in the portion which belongs to the solder paste 12 and is put in contact with the inner wall surface of each through hole 11a and around the portion. In contrast to this, the temperature does not increase in the center portion of the solder paste 12, so that a temperature gradient as shown in FIG. 7B is formed between the center portion of the solder paste 12 and the peripheral portion (the portion in contact with the through hole 11a). That is, the solder paste 12 comes to have a temperature gradient such that the portion put in contact with the inner wall surface of the through hole 11a is at a high temperature and the temperature is gradually reduces from the portion toward the center portion of the solder paste 12. Consequently, as shown in FIG. 7A, the viscosity of the solder paste 12 is reduces at the peripheral portion than in the center portion. This is because the solder paste 12 has a characteristic as shown in FIG. 8, i.e., the characteristic that the viscosity is reduced as the temperature increases. By this induction heating, the viscosity of the solder paste 12 becomes reduced between the inner wall surface of the through hole 11a of the screen mask 11 and the solder paste 12 that is in contact with the inner wall surface, and thus the solder paste 12 is easily separated from the through hole 11a of the screen mask 11, meaning that the stencil separation is satisfactorily achieved.

One example of the material of the solder paste 12 should preferably include 90 percent by weight of metal powder and 10 percent by weight of flux. The metal powder contains about 62 percent by weight of tin and the other component of lead, and its particle diameter is 20 to 40 $\mu$m. The flux has a solvent of 75 to 40 percent by weight of alcohol and the like and 25 to 60 percent by weight of other solid components. The solid components include rosin, activator, and thixotropic agent. As a concrete product name of the solder paste, there can be enumerated the solder paste of a product number MR7125 having 63 percent by weight of tin and 37 percent by weight of lead, produced by Panasonic.

As a material of the screen mask 11, there can be enumerated a stainless-steel-based metal (e.g., SUS304) of nickel-chrome system etc., a nickel-based metal or the like. It is also acceptable to use a screen mask constructed by forming a conductive vapor-deposited film or a plating film on the surface of a synthetic resin such as polyimide and the inner wall surface of the through hole. In this case, an electromagnetic induction can be generated in the portion of the conductive vapor-deposited film or the plating film on the inner wall surface of the through hole.

Furthermore, if the board 14 that serves as the object on which a print is to be formed is constructed of copper having an excellent conductivity, then no heat is generated in the board 14 by the electromagnetic induction, causing no bad influence on the electronic components and so forth on the board.

The print inspecting section 38 measures the state in which the solder paste layer 12a is formed on the land 15 of the board 14, i.e., the shape and position of the solder paste layer 12a by means of a camera or a laser length measuring instrument as an example of the print state detecting means 40, and the volume and the amount of positional displacement of the solder paste layer 12a are calculated by the processing operation section 39 on the basis of the results of measurement. The laser length measuring instrument applies a laser beam to the solder paste layer 12a and calculates the height and so on of the solder paste layer 12a from the position of the reflected light. The above results of calculation are compared with the inspection criteria stored in the inspection criteria storage section 41, and it is than determined whether the print is good or not. The result of decision is output to the control section 34, and if the print is defective, the contents of the defect are numerically expressed and the numeric value is also output to the control section 34. This deciding operation is executed by, for example, calculating the height, width, volume and so on of the solder paste layer 12a from, for example, an image captured by the camera of the print state detecting means 40 or position data measured by the laser length measuring instrument, comparing the decision data of the height, width, volume and so on of the solder paste layer stored in the inspection criteria storage section 41 with the above calculated values in the processing operation section 39, and deciding whether the print is good or not.

The process control section 35 changes the parameter setting of the printing apparatus on the basis of the post-printing data of the state in which the solder paste 12 is printed, made by the print inspecting section 38. In this case, the above parameters include, for example, the parameters of each unit stored in the acceptable product print database 37 (for example, printing velocity, tilt angle of the squeegee 13, environmental temperature during printing (for example, squeegee temperature, screen mask temperature, board temperature, and temperature of air and the like around them, enumerated in the order of importance), printing pressure, i.e., pressure of the squeegee 13 pressed against the screen mask 11, stencil separation velocity of the board 14, and profile of acceleration) and induction heating conditions (for example, heating output, heating time, and heating start timing). Relations between the parameters and the print quality are stored as database, and the optimum parameters are calculated by the processing operation section 36 of the process control section 35.

The above printing method to be implemented by the above printing apparatus will be described with reference to the flowchart of FIG. 4. It is to be noted that this sequence of operations is controlled by the control section 34.

In step S1, the screen mask 11 is carried in to the stage section 20 by the carrying-in unit 21a of the board carrying-in and carrying-out unit 21.

Next, in step S2, the board 14 carried in to the stage section 20 is supported by the board support unit 22.

Next, in step S3, the board position recognizing and correcting section 30 recognizes the position of the board 14 retained by the board support unit 22 and calculates the position correction amount of the board 14 relative to the screen mask 11.

Next, in step S4, the positions in the XYθ-directions of the board 14 relative to the screen mask 11 are each corrected by the XYθ-position correcting unit 25 of the stage section 20 on the basis of the above calculated position correction amount.

Next, in step S5, the board 14 is positioned in the printing position below the screen mask 11 by the stage section 20, and the board 14 is moved up by the stage section 20 so that the screen mask 11 comes in contact with the upper surface of the board 14.

Next, in step S6, the squeegee 13 is moved on the screen mask 11, thereby filling the solder paste 12 into the through holes 11a of the screen mask 11.

Next, in step S7, it is determined whether or not the screen mask 11 is to be inductively heated. When the induction heating is not executed as in the case where the solder paste 12 easily separates from the through holes 11a, the program flow proceeds to step S8. When the induction heating is executed, the program flow proceeds to step S9 to set the timer 29 to a predetermined heating time. Immediately after the completion of the printing of the solder paste 12 in step S10, the screen mask 11 is inductively heated by the induction coil 28a of the induction heating section 28.

When the induction heating is executed, the stencil separation operation is executed in step S8 immediately after the execution of the induction heating. That is, by driving the stencil separation unit 26 of the stage section 20, the board 14 is moved down relative to the screen mask 11 to separate the board 14 from the screen mask 11 and transfer the solder paste 12 from inside the through holes 11a of the screen mask 11 onto the lands 15 of the board 14. When no induction heating is executed, the above stencil separation operation is executed after the completion of the printing of the solder paste 12, thereby transferring the solder paste 12 from inside the through holes 11a of the screen mask 11 onto the lands 15 of the board 14.

Next, in step S12, the shapes, positions and so on of the solder paste layers 12a formed on the board 14 are inspected by the print inspecting section 38.

Next, in step S13, it is determined whether the print state is good or not based on the result of the above inspection. When it is determined that the print state is good, the program flow proceeds to step S14 to carry the board 14 out of the printing apparatus by the carrying-out unit 21b in step S14, and the sequence of printing operations ends. When it is determined that the print state is defective in step S13, the program flow proceeds to step S15 to change the design of the process parameter(s) by the process control section 35 and end the sequence of printing operations. The next printing of the solder paste 12 is executed on the basis of the optimum condition information obtained through the design change in step S15, and the post-printing stencil separation process in step S8 and the induction heating process of the screen mask 11 in step S10 are executed. Depending on the particular cases, it is also acceptable to remove the solder paste layer(s) that has been determined to be defectively printed, execute a new printing operation under the condition(s) obtained through the design change in step S15 and execute the post-printing stencil separation process in step S8 and the induction heating process of the screen mask 11 in step S10.

In this flowchart, the process of executing the stencil separation process in step S8 by changing the design of the stencil separation conditions and the induction heating process in steps S9 and S10 by changing the design of the induction heating condition(s) are shown as an example. For this parameter design change, all the parameters are not simultaneously changed in design, but only the appropriately selected parameter(s) are changed in design according to the print state.

According to the above embodiment, the screen mask 11 itself is heated by the induction heating, so that the outer peripheral portion of the solder paste 12 put in contact with the inner wall surface of each of the through holes 11a of the screen mask 11 comes to have a temperature that has increased more than that in the center portion, consequently acquiring a reduced viscosity. As a result, the adhesive force between the inner wall surface of the through hole 11a of the screen mask 11 and the solder paste 12 is reduced, so that the solder paste 12 easily separates from the screen mask 11, thereby allowing the stencil separation operation to be satisfactorily achieved. Therefore, the solder paste 12 is not left on the screen mask 11 side causing no blur of print in the next printing stage, so that a specified amount of solder paste 12 can be supplied, that is, the solder paste 12 can be supplied in the specified shape to the specified position, thereby allowing the solder paste layer(s) 12a to be formed as a print.

Furthermore, according to the above induction heating operation, the screen mask 11 itself generates heat, so that the heat discharge of the screen mask 11 can be performed immediately after the stop of the induction heating operation. In addition, the members other than the screen mask 11 are not heated, so that no adverse influence is exerted on the next printing operation, the peripheral units around the screen mask 11 and so on. In contrast to this, according to the method of merely radiating heat from the outside of the screen mask 11 to heat the screen mask 11 as observed in the case of hot air, radiation heating (infrared heating), or conduction heating, the members and air around the screen mask 11 are heated, and the members and air around the heating unit are heated due to the heating of the heating unit itself. This sometimes might adversely effect the next printing operation, the units around the screen mask 11 and so on. Furthermore, according to the method oaf conducting heat from the heating unit to the screen mask 11, heat is conducted not only to the screen mask 11 but also to the heating unit and the members and air around the screen mask 11, thereby causing a drawback in that the heating efficiency is bad.

When executing the induction heating operation in a noncontact manner without putting the induction heating section 28 in contact with the screen mask 11, the induction coil 28a of the induction heating section 28 does not come in contact with the solder paste 12 left on the surface of the screen mask 11, and therefore, the induction coil 28a is not smeared by the solder paste 12. According to this noncontact method, when there is an electronic component(s) on the lower surface of the board 14, the distance to the electronic component is increased, so that the possible exertion of negative influence on the electronic component during the induction heating can be prevented.

Figure 11A:
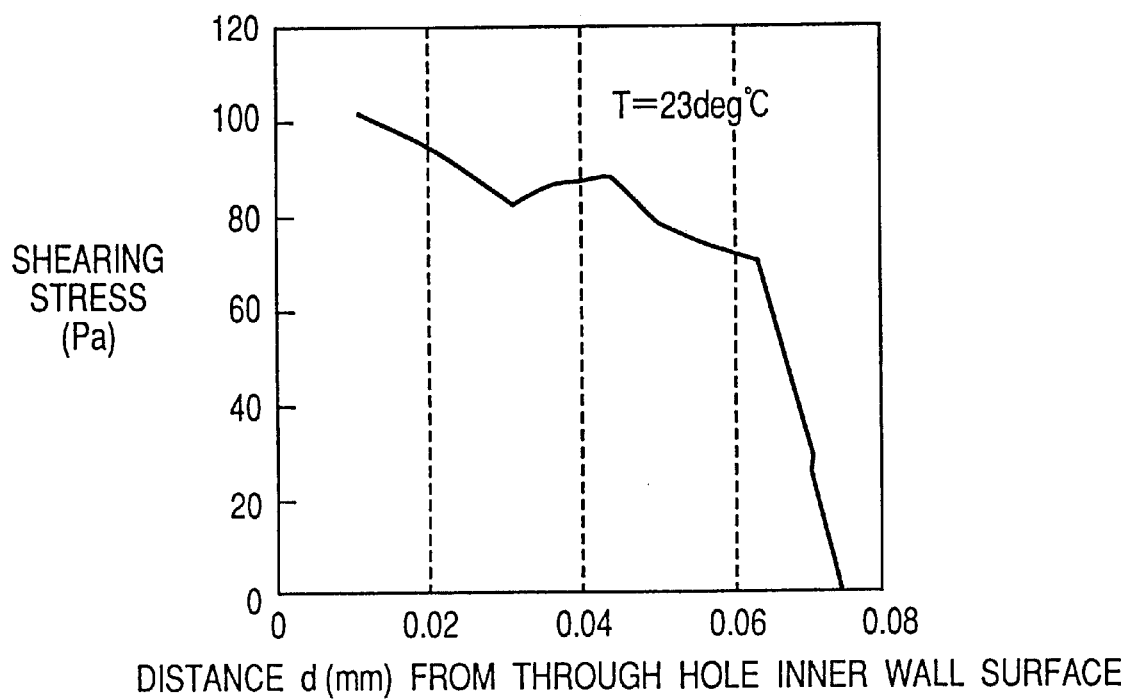
FIG. 11A and FIG. 11B are a graph showing a relation between a distance from the inner wall of the through hole of the screen mask and a shearing force and an explanatory view thereof, respectively.
Figure 11B:
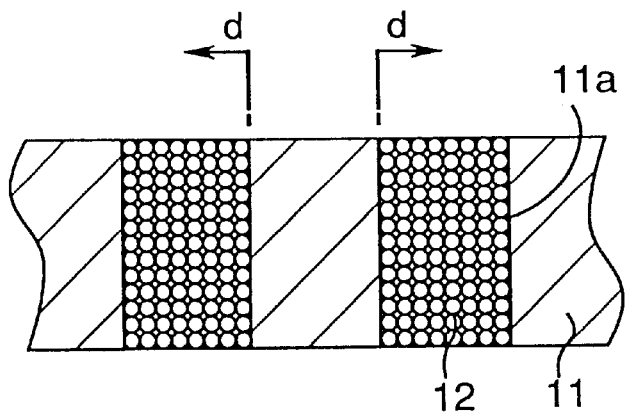

In this case, an experiment was conducted to determine the degree to which the solder paste 12 of a fine pattern could be satisfactorily separated from the through holes 11a by induction heating. The diameter of the through hole was about 0.1 mm, and the distance between the centers of through holes, i.e., the pitch between adjacent through holes was 0.2 mm. The environmental temperature of the air, solder paste, screen mask and so on around the through hole was 23° C. The experiment results are shown in FIG. 11A and FIG. 11B. As shown in FIG. 11A and FIG. 11B, according to this experiment, the shearing force of the solder paste 12 filled in the through hole 11a of the screen mask 11 at the time of separation from the stencil exhibits no reduction in shearing force in the portion of a through hole pitch of not greater than 0.2 mm. This implied that a pitch of 0.2 mm is the limit of the fine printing and no significant reduction in shearing force could be expected when a distanced from the inner wall surface of the through hole was not greater than 0.05 mm.

Therefore, according to the present invention, by taking advantage of the induction heating, the fine printing at a pitch of 0.3 mm, which has been difficult, conventionally can be satisfactorily performed, and fine printing can also be performed to the extent of a pitch of about 0.2 mm depending on the conditions of the solder paste and so on.

With regard to the induction heating conditions, by supplying the electric power of 1400 W for one to two seconds, the temperature of the screen mask 11 can be increased to about 50 to 70° C. with interposition of a gap of 1 mm. Furthermore, by setting the supply power to about 2000 W, the equivalent temperature increase can be achieved within one second, whereby the solder paste inside the through hole 11a is allowed to achieve a greater temperature difference between the inner wall surface of the through hole 11a and the center portion thereof. By putting the induction coil in contact with the screen mask 11, a more efficient temperature increase can be achieved.

According to the above induction heating stencil separation process, the temperature difference between the inner wall surface of the through hole 11a and the center portion of the through hole 11a depends on the through hole width. Therefore, according to the screen mask having a plurality of types of through hole widths, it is preferable that the condition setting is performed in accordance with the minimum through hole size among the plurality of through holes to be subjected to the induction heating. That is, if the minimum through hole width is about 0.15 mm, as described above, then there is necessitated such a sharp control as the supply of a power of 2000 W to the induction coil for a supply time of about one second. However, in the case of a plurality of through holes which are relatively roughly arranged so that the minimum through hole width of the through holes is 1 mm, then the supply power is allowed to be 1000 W and the supply time is allowed to be two to three seconds. Therefore, the heating conditions of the induction coil can be preparatorily determined according to the pattern of the screen mask (i.e., the arrangement, size and so on of the through holes). In such a case, the induction coil heating conditions conforming to the through hole size may be set to the heating conditions close to the optimum characteristic values appropriate for the separation from the stencil of each through hole obtained from the previously-measured characteristic values (viscosity, shearing stress value and yield value with respect to temperature) of the solder paste.

It is to be noted that the temperature control can also be executed by induction heating when executing the mask cleaning of the screen mask 11. By this operation, the solder paste left inside the through hole and the rear surface of the screen mask can be more efficiently removed. The conditions in this case are not required to be controlled strictly as compared with the time of separation from the stencil, and the screen mask is required to be heated to such an extent that the solder paste comes to have a good flowability. The heating may be executed with, for example, a power of 1000 W during the cleaning time.

It is to be noted that the present invention is not limited to the above embodiment, and the invention can be implemented in a variety of forms.

For example, in the above embodiment, the board 14 is moved down in the state in which the screen mask 11 is made stationary in order to separate the screen mask 11 from the board 14 relative to each other. However, the present invention is not limited to this, and the screen mask 11 may be moved in a state in which the board 14 is stationary. It is also acceptable to move both the screen mask 11 and the board 14 in-directions in which they are separated from each other.

The printing paste is not limited to the solder paste 12, and any arbitrary material may be used so long as the present invention can be applied. For example, the material may be constructed of a metal powder having a minute particle diameter of not greater than about 200 $\mu$m and a flux instead of the solder paste. Examples, of this metal powder are silver or copper.

In the case of screen printing, the induction heating is effected after the completion of the printing paste scraping operation by the squeegee. However, the present invention is not limited to this, and it is acceptable to start the induction heating simultaneously with the scraping operation, execute the heating at a temperature lower than the specified heating temperature in the initial stage and increase the temperature of the outer peripheral portion of the printing paste to the above specified temperature by the induction heating after the completion of the scraping operation for the reduction in viscosity of the paste.

The present invention is not limited to the uniform induction heating of the whole body of the screen mask 11, and it is acceptable to make the induction coil 28a partially face the portion in which the separation of the solder paste 12 from the stencil is unsatisfactory among the circuit pattern, and inductively heat only the portion.

Figure 9:
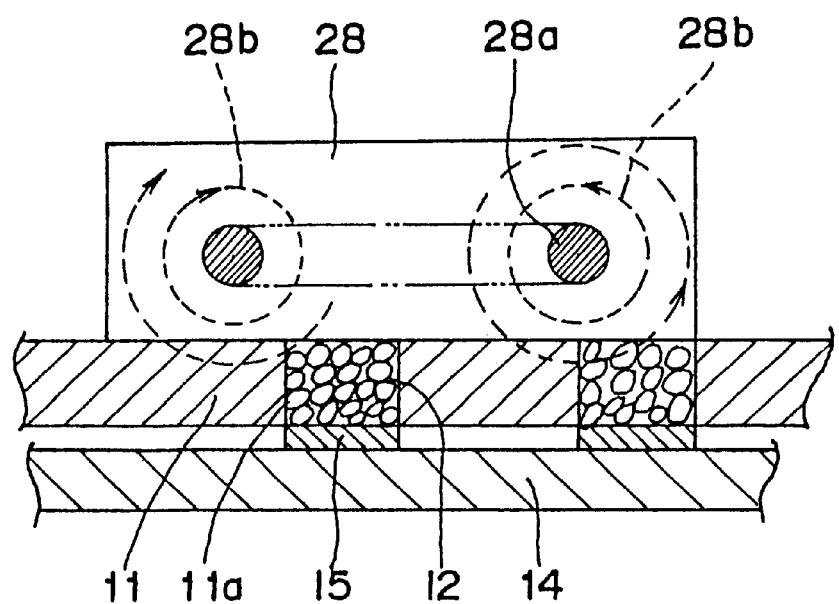
FIG. 9 is a sectional view of one embodiment of the present invention, in which the screen mask heating unit is in direct contact with the screen mask.

The present invention is not limited to the noncontact induction heating, and as shown in FIG. 9, it is acceptable to inductively heat the induction heating section 28 in contact with the upper surface of the screen mask 11. In this case, the distance between the induction coil 28a of the induction heating section 28 and the screen mask 11 is reduced, and therefore, the induction heating can be efficiently effected in a locally concentrated manner. It is to be noted that the reference numeral 28b in FIG. 9 denotes an induction magnetic field.

Figure 10A:
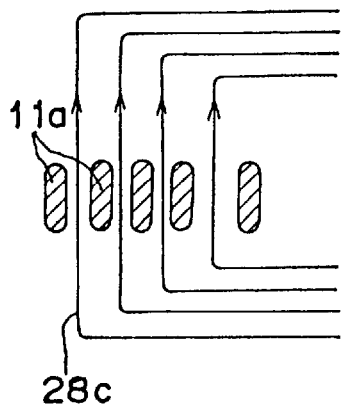
FIG. 10A, FIG. 10B, FIG. 10C, and FIG. 10D are explanatory views of states in which through holes of the screen mask are arranged in the X-direction, Y-direction, and at an angle of 45 degrees, and a perspective view of a QFP having a pattern of through holes as shown in FIG. 10C, respectively.
Figure 10C:
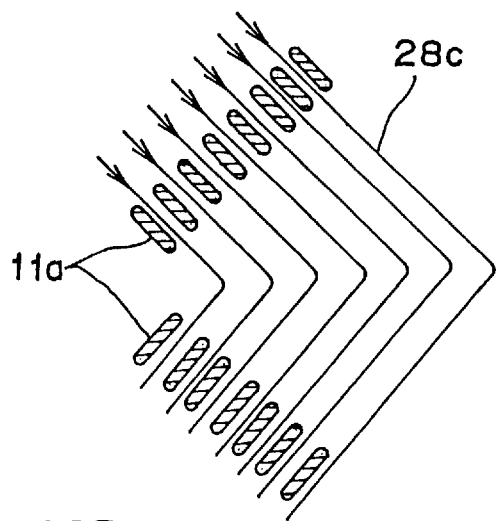
Figure 10B:
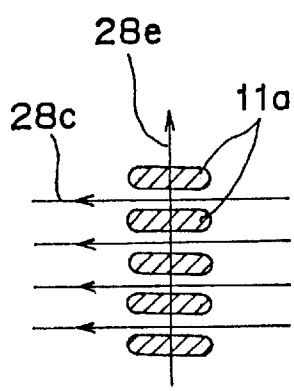
Figure 10D:
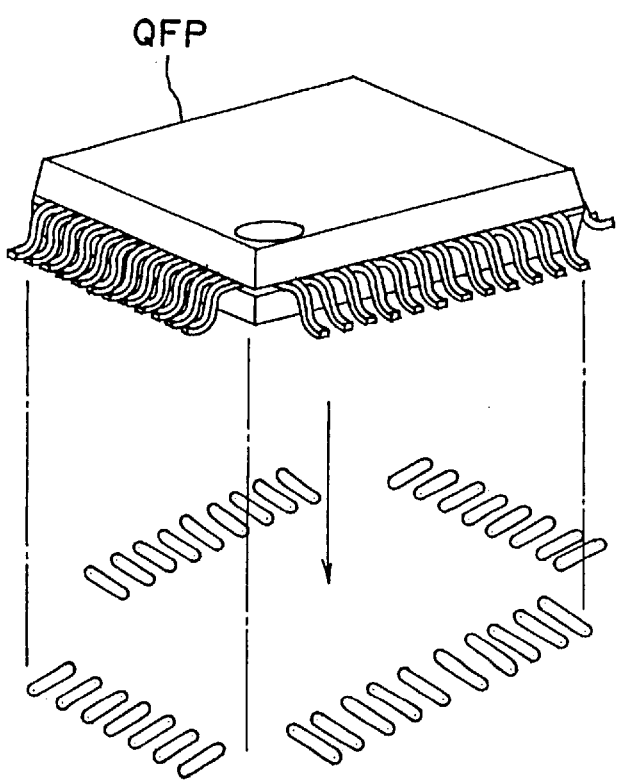

There is a tendency that the inner wall surface of a through hole elongated in a direction in which the induction heating induction current flows is easily inductively heated, and the inner wall surface of a through hole elongated in a direction perpendicular to the direction in which the induction current flows is hardly inductively heated. Therefore, as shown in FIG. 10A, it is preferable in terms of heat generating efficiency for the through hole 11a, elongated in the X-direction, to arrange an induction coil 28c in the lengthwise direction of this through hole 11a and generate an induction current by flowing a current through the induction coil as indicated by the line denoted by 28c in FIG. 10A. Therefore, as shown in FIG. 10B, it is also preferable for the through hole 11a elongated in the Y-direction to arrange an induction coil 28c in the lengthwise direction of the hole 11a and generate an induction current by flowing a current through the induction coil as indicated by the line denoted by 28c in FIG. 10B. In this FIG. 10B, if the induction coil is arranged in the direction of arrow 28e and an induction current flows through the induction coil, then the inner wall surface of the through hole 11a along the Y-direction does not generate much heat. In the case of a QFP (Quad Flat Package) as shown in FIG. 10D, the lengthwise directions of the through holes 11a of adjacent sides cross each other at an angle of 45 degrees. Therefore, it is preferable in terms of heat generating efficiency to arrange an induction coil in a V-figured shape as shown in FIG. 10C and generate an induction current by flowing a current through the induction coil as indicated by the line denoted by 28c in FIG. 10C.

For example, it is acceptable to overlap a first induction coil for flowing a current in the X-direction as shown in FIG. 10A and a second induction coil for flowing a current in the Y-direction as shown in FIG. 10B and then, use the coils as one induction heating section. By supplying electric power to either one of the first induction coil and the second induction coil or alternately to the first induction coil and the second induction coil in the induction heating section in which two induction coils are overlapped as described above, even though the through hole pattern is varied, an identical induction heating section can flow a current through the induction coil only in the X-direction for the through holes arranged along the X-direction as shown in FIG. 10A, flow a current through the induction coil only in the Y-direction for the through holes arranged along the Y-direction as shown in FIG. 10B, or flow a current through the two induction coils alternately arranged in the X-direction and the Y-direction for the through holes extending in both the X-direction and Y-direction as shown in FIG. 10C and FIG. 10D. As a result, both the through hole 11a along the X-direction and the through hole 11a along the Y-direction can be roughly equally heated inductively for the through holes shown in FIG. 10C and FIG. 10D. Even if the through hole pattern is varied as shown in FIG. 10A, FIG. 10B, FIG. 10C, and FIG. 10D, then the identical induction heating section can flow a current through the induction coil only in the X-direction, flow a current through the induction coil only in the Y-direction, or flow a current through the induction coils alternately in the X-direction and the Y-direction, so that the general-purpose properties of the induction heating section can be improved.

Figure 12A:
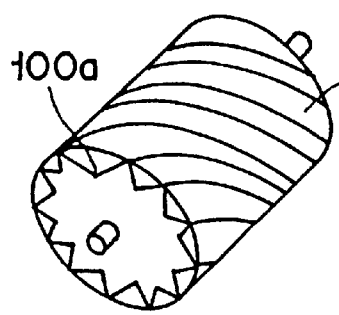
FIG. 12A and FIG. 12B are a perspective view of a filling roller in one embodiment of the present invention that employs the cylindrical filling roller in place of a squeegee and a partially sectional explanatory view of a print state achieved by the filling roller, respectively.
Figure 12B:
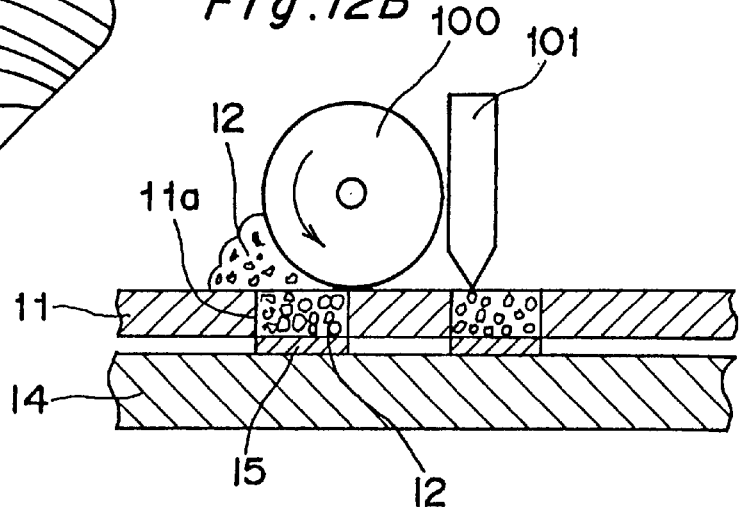

FIG. 12A and FIG. 12B show an embodiment of the present invention according to the screen printing system, in which a filling roller 100 for filling the solder paste 12 is used instead of the squeegee. In this embodiment, the cylindrical filling roller 100 is rotated to hold printing material, e.g., the solder paste 12 and forcibly fill the solder paste 12 into the through holes 11a of the screen mask 11. The cylindrical shape of the filling roller 100 may alternately be the sawtooth-shaped one having spiral grooves 100a shown in FIG. 12A. It is to be noted that the reference numeral 101 denotes a solder paste-scraping-use scraper in FIG. 12A.

Figure 13A:
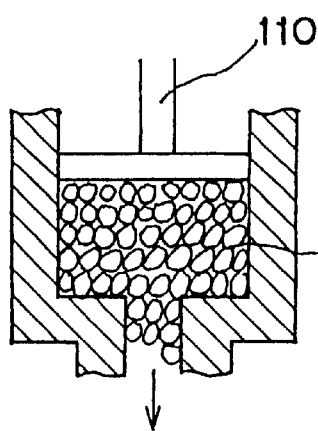
FIG. 13A and FIG. 13B are an explanatory view of one embodiment of the present invention that takes advantage of an extruding function of a piston in place of a squeegee and an explanatory view of one embodiment of the present invention that takes advantage of an extruding function by compressed air, respectively.
Figure 13B:
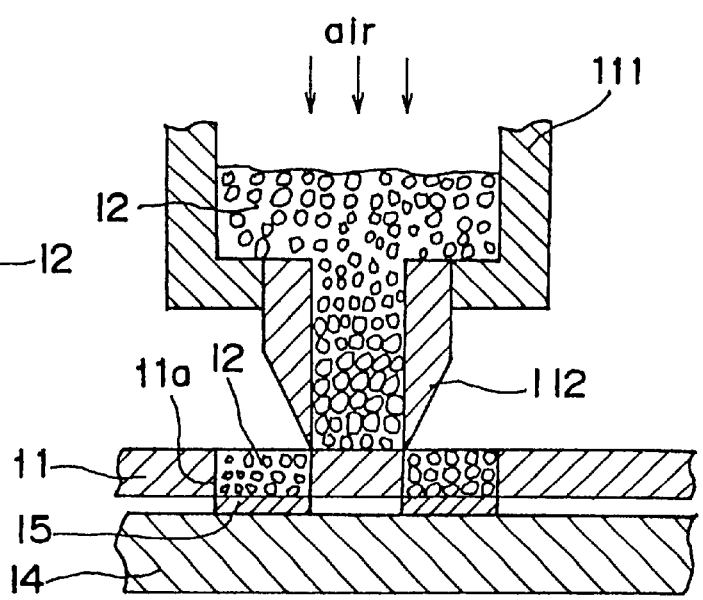

According to an embodiment in which the present invention is applied to a dispensing system, it is acceptable to forcibly fill a print material 112 such as solder paste into the through holes 11a of the screen mask 11 by means of a nozzle 111 having an extruding function of a piston 110 as shown in FIG. 13A or an extruding function of compressed air as shown ion FIG. 13B. In FIG. 13B, the reference numeral 112 denotes a solder paste-scraping-use scraper provided at the tip of the nozzle 111.

The present invention can also be applied not only to screen printing but also to other printing methods.

For example, FIG. 14 shows an embodiment in which the present invention is applied to a direct-printing planographic transfer printing system. In this case, a print material 122 supplied in a specified pattern on a flat plate 120 is directly transferred to a specified position 115 of a board 114 that is the object on which a print is to be formed. In FIG. 14, the adhesive force between the flat plate 120 and the print material 122 is reduced by inductively heating a surface on which the print material 122 is in close contact with the flat plate 120, thereby producing an effect of facilitating the emigration of the print material to the specified position 115 of the object 114 on which a print is to be formed.

FIG. 15A and FIG. 15B show an embodiment in which the present invention is applied to an offset printing system. A print material 142 is supplied from a tank 139 stored with the print material 142 to recess portions 136a of a plate cylinder 136 by three rollers 140, thereby transferring the print material 142 inside the recess portions 136a onto a rubber cylinder 137. The print material 142 on the rubber cylinder 137 is transferred and printed on a paper 135 that serves as the object which is to be put between the rubber cylinder 137 and an impression cylinder 138 and on which a print is to be formed. In this embodiment, by inductively heating the inner wall surfaces of the recess portions 136a of the plate cylinder 136 with which the print material 122 is closely put in contact, the adhesive force between the inner wall surface of the recess portion 136a of the plate cylinder 136 and the print material 122 is reduced, thereby allowing the print material to be easily transferred onto the paper 135.

Figure 16:
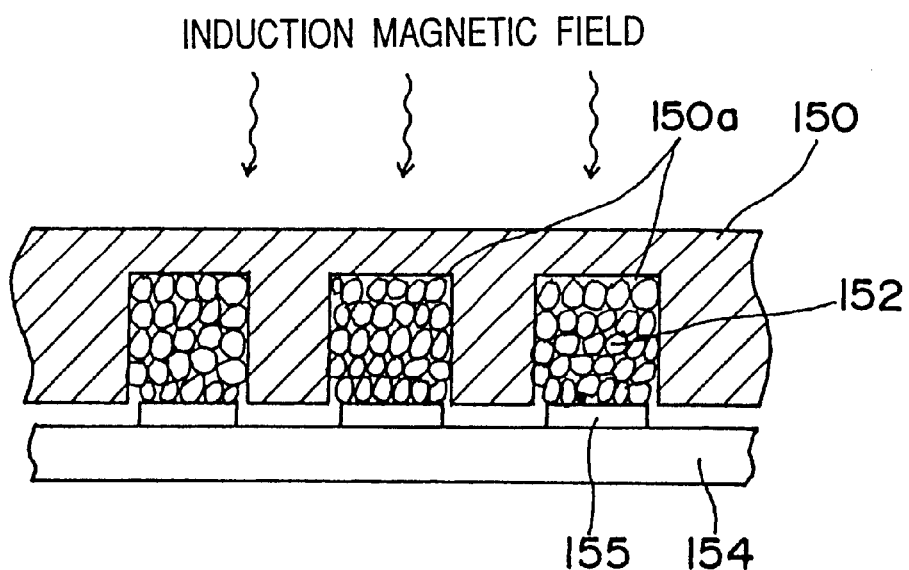
FIG. 16 is an explanatory view of one embodiment of the present invention in the case where the present invention is applied to a planographic intaglio transfer printing system.

Further, FIG. 16 shows an embodiment in which the present invention is applied to a planographic intaglio transfer printing system. In this embodiment, by increasing the temperature of an intaglio 150 itself through inductively heating the intaglio 150 similar to the screen printing system, there can be obtained the effect that the shearing force of the print material such as solder paste 152 on the inner wall surface of each of recess portions 150a is reduced and the transferability to specified positions 155 such as lands of a board 154 is improved.

Figure 17:
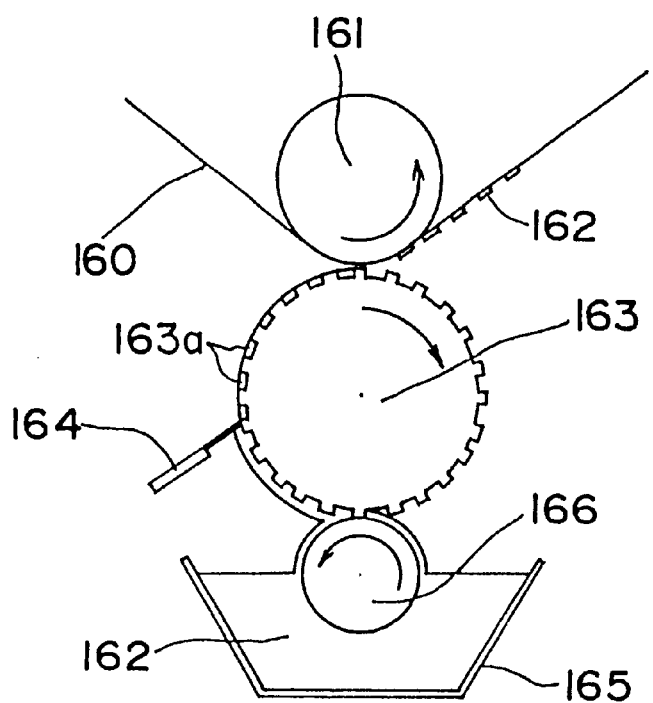
FIG. 17 is an explanatory view of one embodiment of the present invention in the case where the present invention is applied to an intaglio transfer printing system (gravure printing system)
Figure 18A:
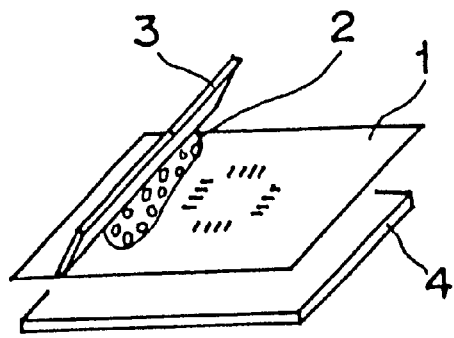
FIG. 18A, FIG. 18B, FIG. 18C, FIG. 18D, and FIG. 18E are, respectively, explanatory views showing a prior art screen printing system.
Figure 18B:
Figure 18C:
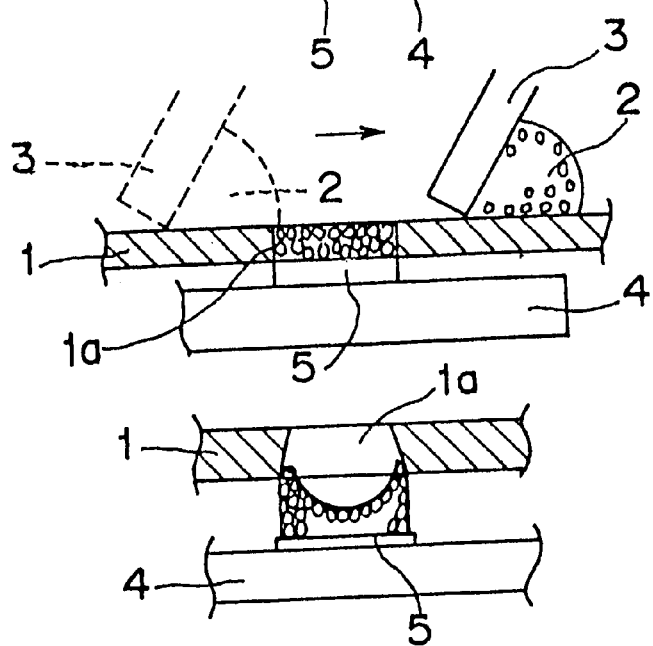
Figure 18D:
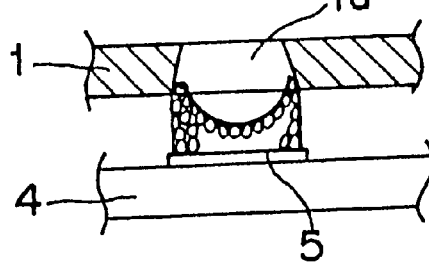
Figure 18E:
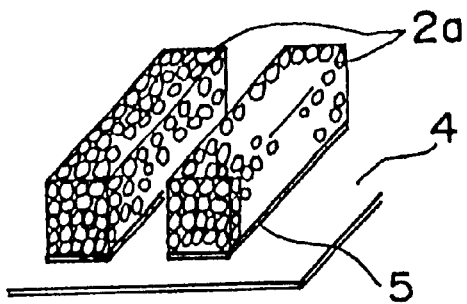
Figure 19A:
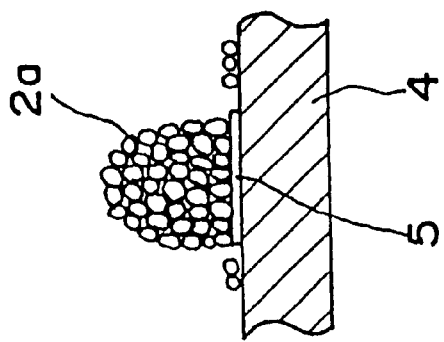
FIG. 19A, FIG. 19B, FIG. 19C, and FIG. 19D are, respectively, explanatory views showing a prior art screen printing system.
Figure 19B:
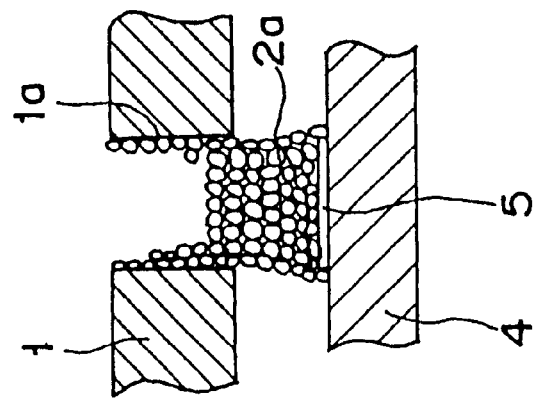
Figure 19C:
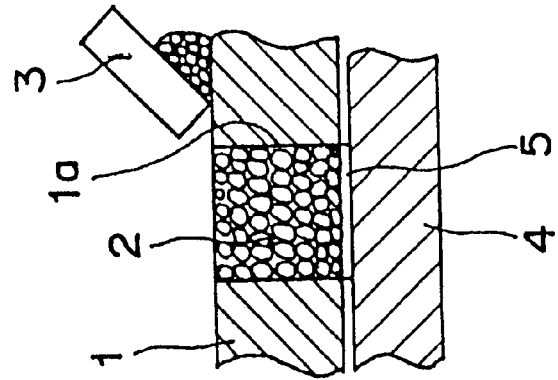
Figure 19D:
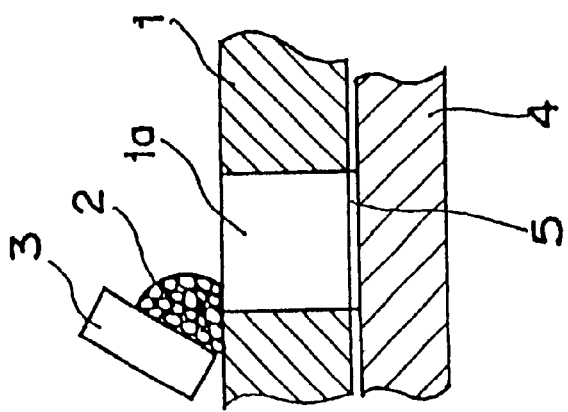

FIG. 17 shows an embodiment in which the present invention is applied to an intaglio transfer printing system (gravure printing system). A print material such as solder paste 162 inside a tank 165 is supplied to recess portions 163a of a plate cylinder 163 by a supply roller 166, and the print material 162 in the recess portions 163a is transferred and printed onto a base material 160 held between the plate cylinder 163 and an impression cylinder 161. In FIG. 17, the reference numeral 164 denotes a doctor, and this doctor 164 scrapes off an excessive amount of print material 162 of the print material 162 filled into the recess portions 163a. In this embodiment, by increasing the temperature of the plate cylinder 163 itself through inductively heating the plate cylinder 163 similar to the screen printing system, there can be obtained the effect that the shearing force of the print material 162 on the inner wall surface of each of the recess portions 163a is reduced and the transferability to the base material 160 is improved.

Figure 23:
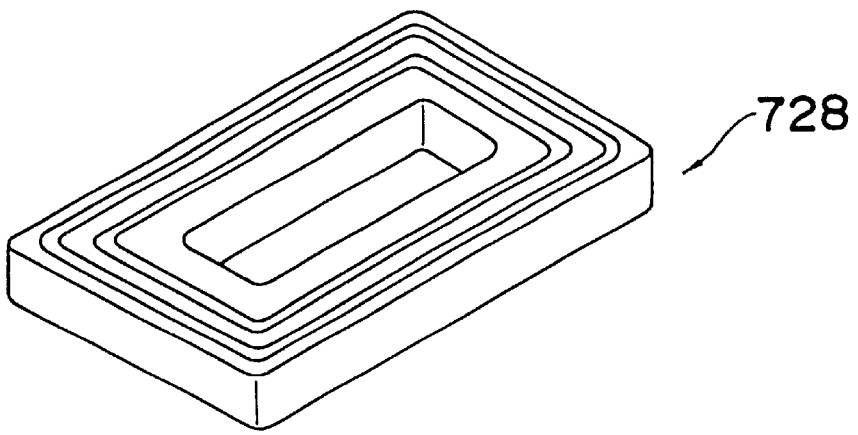
FIG. 23 is a perspective view of a rectangular induction coil according to another embodiment of the present invention.

FIG. 23 shows a perspective view of an induction coil according to another embodiment of the present invention. The induction coil is not limited to the annular one, and the induction coil may be a square-frame-shaped or a rectangular-frame-shaped induction coil 728.

Figure 24:
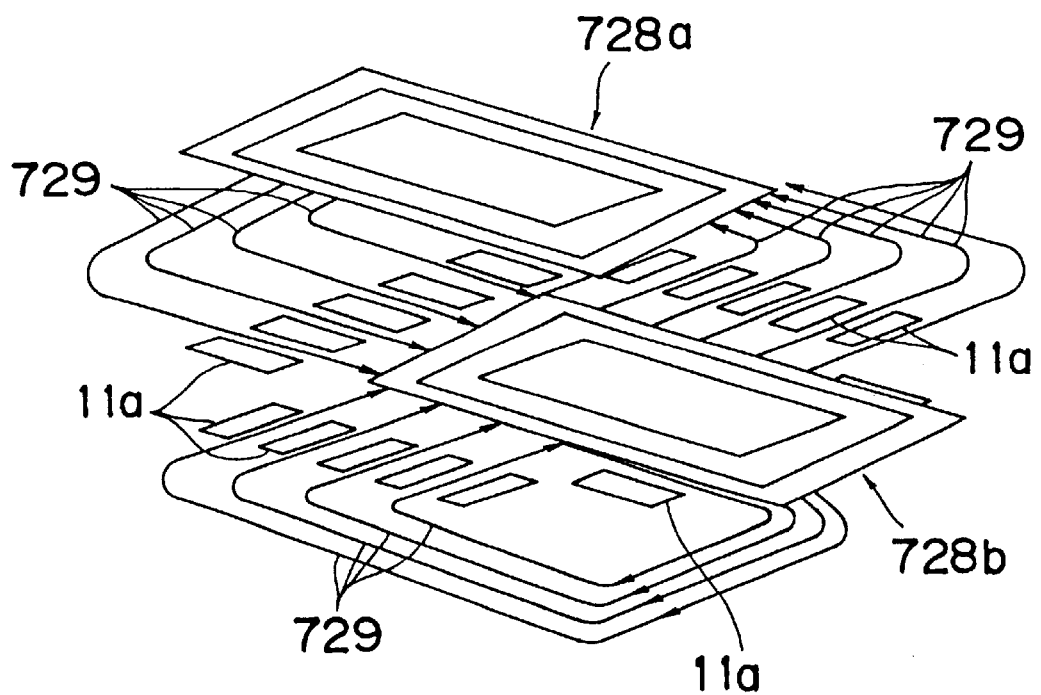
FIG. 24 is a perspective view showing a state in which two induction coils of FIG. 23 are prepared and arranged at two corners located in diagonal positions of a QFP so as to flow an induction current in the lengthwise direction of each through hole.
Figure 25:
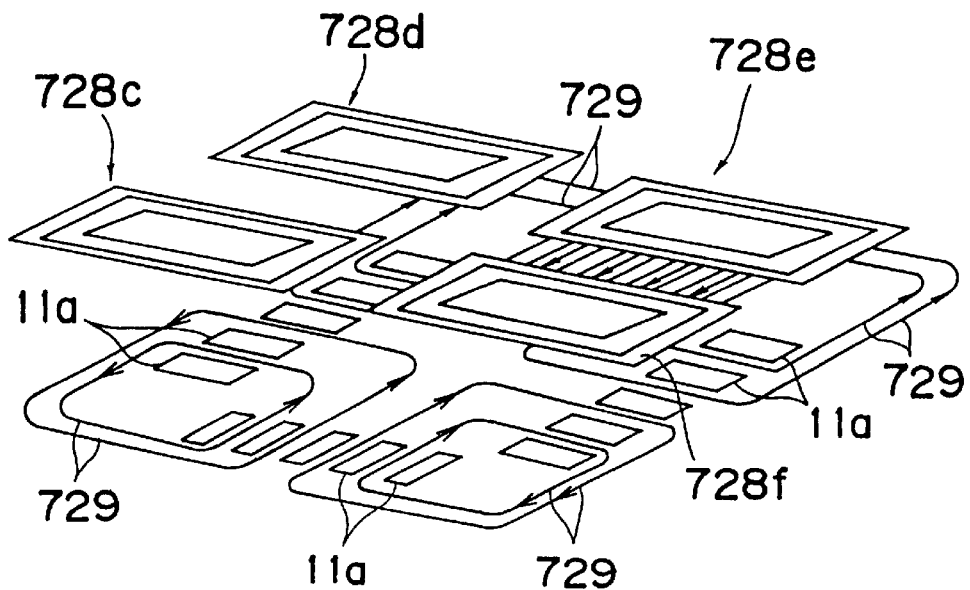
FIG. 25 is a perspective view showing a state in which four induction coils of FIG. 23 are prepared and arranged at the four corners of a QFP so as to flow an induction current in the lengthwise direction of each through hole.

FIG. 24 is a perspective view showing a state in which two units 728a and 728b of the induction coil 728 of FIG. 23 are prepared and arranged at two corners located in diagonal positions of a board on which a QFP is to be positioned and an induction current 729 is flowed in the lengthwise direction of each through hole 11a. The two induction coils 728a and 728b are preferably operated simultaneously FIG. 25 is a perspective view showing a state in which four units 728c, 728d, 728e, and 728f of the induction coil 728 of FIG. 23 are prepared and arranged at the four corners of a board on which a QFP is to be positioned and an induction current 729 is flowed in the lengthwise direction of each through hole 11a. In this case, the four induction coils 728c through 728f are also operated simultaneously.

Figure 26:
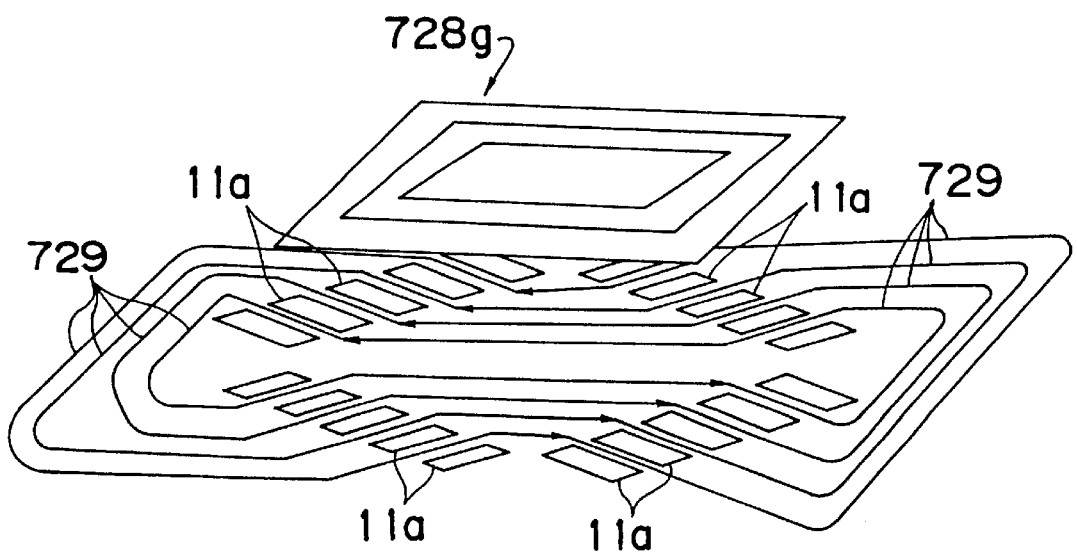
FIG. 26 is a perspective view showing a state in which one induction coil of FIG. 23 is prepared and arranged above a QFP in a form inclined at an angle of 45 degrees with respect to the through hole pattern so as to flow an equal amount of induction current through each through hole.

FIG. 26 is a perspective view showing a state in which one induction coil 728g of FIG. 23 is prepared and arranged above a board portion on which a QFP is to be positioned and one side edge of the induction coil 728g is arranged in a form inclined at an angle of 45 degrees with respect to the direction in which the through holes 11a are arranged, so that an equal amount of induction current 729 flows through each through hole 11a.

The entire disclosure of Japanese Patent Application No. 8-123393 filed on May 17, 1996, including specification, claims, drawings, and summary are incorporated herein by reference in its entirety.

Although the present invention has been fully described in connection with the preferred embodiments thereof with reference to the accompanying drawings, it is to be noted that various modifications of the disclosed invention will be apparent to those skilled in the art. Such modifications are to be understood as included within the scope of the present invention as defined by the appended claims unless they depart therefrom.

What is claimed is:

1. A printing method comprising:

delivering a printing paste into an opening portion of a stencil so as to retain the printing paste therein, wherein a viscosity of the printing paste is reduced as a temperature thereof is increased;

heating a portion of the stencil, which defines the opening portion in which the printing paste is retained, so as to reduce the viscosity of the printing paste that is in contact with the heated portion of the stencil, wherein the stencil portion is heated after printing paste is retained in the opening portion of the stencil thereby permitting the printing paste to be easily separated from the stencil; and separating the printing paste, which is retained in the stencil, from the stencil so as to print the printing paste on an object on which a print is to be formed.

2. A printing method as claimed in claim 1, wherein the heating operation is performed by electromagnetic induction heating to increase the temperature of the portion of the stencil.

3. A printing method as claimed in claim 2, wherein the opening portion of the stencil is arranged in a specified pattern for retaining the printing paste, and the stencil and the object contact each other and then are relatively separated following the heating operation in order to print the printing paste onto the object.

4. A printing method as claimed in claim 3, wherein the electromagnetic heating is performed by an electromagnetic induction heating unit in a non-contact manner.

5. A printing method as claimed in claim 4, further comprising spacing the electromagnetic induction heating unit and the stencil at an interval such that a specified induction current flows through the stencil by the electromagnetic induction heating unit.

6. A printing method as claimed in claim 3, wherein said opening portion of the stencil is a through hole and the stencil is a screen mask, and the printing paste is delivered into the through hole by moving a squeegee.

7. A printing method as claimed in claim 3, further comprising detecting a print state after the printing paste is printed on the object, wherein an electromagnetic heating condition of the stencil or a separation condition of the stencil from the object is controlled on the basis of the detected print state.

8. A printing method as claimed in claim 3, wherein the printing paste retained in the opening portion of the stencil has a temperature gradient such that the portion of the printing paste in contact with the opening portion of the stencil has a high temperature relative to the temperature of the printing paste disposed in a central portion of the opening portion and not contacting the stencil.

9. A printing apparatus comprising:

a stencil having an opening portion for retaining printing paste therein;

a heating unit for increasing a temperature of the opening portion of the stencil, wherein said heating unit is operable to heat the opening portion of the stencil so that the viscosity of printing paste retained in the opening portion of the stencil and in contact with the opening portion is reduced, thereby making the printing paste easily separable from the stencil;

a printing paste separation unit for separating the printing paste, which is retained in the stencil, from the stencil so as to print the printing paste on an object on which a print is to be formed; and a control section for controlling the heating of the opening portion of the stencil by the heating unit and separation of the separation unit and the printing paste, wherein the control section is operable to control the heating of the opening portion of the stencil after printing paste is retained in the opening portion of the stencil in order to reduce the viscosity of the printing paste that is in contact with the opening portion of the stencil, thereby permitting the printing paste to be easily separated from the stencil so as to print the printing paste on an object on which a print is to be formed.

10. A printing apparatus as claimed in claim 9, wherein said heating unit comprises an electromagnetic induction heating unit for heating the opening portion of said stencil to thereby reduce the viscosity of the printing paste in contact with the opening portion of the stencil.

11. A printing apparatus as claimed in claim 10, wherein said printing paste separation unit is operable to move said stencil relative to the object after said stencil comes into contact with the object to thereby print the printing paste onto the object, wherein the opening portion of said stencil is arranged in a specified pattern.

12. A printing apparatus as claimed in claim 11, wherein said electromagnetic induction heating unit is operable to heat said stencil in a non-contact manner.

13. A printing apparatus as claimed in claim 12, wherein said electromagnetic induction heating unit is spaced from said stencil by a specified interval so that a specified induction current flows through said stencil.

14. A printing apparatus as claimed in claim 11, further comprising a squeegee for delivering the printing paste to the opening portion of said stencil, wherein the opening portion of said stencil comprises a through hole, and said stencil comprises a screen mask.

15. A printing apparatus as claimed in claim 11, further comprising a control section for detecting a print state after the printing paste is printed on the object, said control section also controlling an electromagnetic induction heating condition of said stencil or a condition of the separation of said stencil from the object based on a result of the detection.

16. A printing apparatus as claimed in claim 11, wherein said electromagnetic induction heating unit is operable to heat the opening portion of said stencil so that printing paste retained in the opening portion and contacting said stencil will be heated before printing paste contained in a central portion of the opening portion.

17. A printing apparatus as claimed in claim 9, wherein said heating unit comprises an electromagnetic induction heating unit for heating the opening portion of said stencil to thereby reduce the viscosity of the printing paste in contact with the opening portion of the stencil.

* * * * *